United States Patent
Masuduzzaman et al.

(10) Patent No.: US 9,711,211 B2
(45) Date of Patent: Jul. 18, 2017

(54) DYNAMIC THRESHOLD VOLTAGE COMPACTION FOR NON-VOLATILE MEMORY

(71) Applicant: SANDISK TECHNOLOGIES INC., Plano, TX (US)

(72) Inventors: Muhammad Masuduzzaman, Milpitas, CA (US); Tai-Yuan Tseng, Milpitas, CA (US); Huai-Yuan Tseng, San Ramon, CA (US); Deepanshu Dutta, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/926,180

(22) Filed: Oct. 29, 2015

(65) Prior Publication Data

US 2017/0125087 A1     May 4, 2017

(51) Int. Cl.
| | | |
|---|---|---|
| *G11C 16/00* | (2006.01) | |
| *G11C 11/56* | (2006.01) | |
| *G11C 16/04* | (2006.01) | |

(52) U.S. Cl.
CPC ...... *G11C 11/5628* (2013.01); *G11C 16/0483* (2013.01)

(58) Field of Classification Search
CPC ............ G11C 11/5628; G11C 16/3404; G11C 16/3418; G11C 16/10
See application file for complete search history.

(56) References Cited

U.S. PATENT DOCUMENTS

| | | | |
|---|---|---|---|
| 5,428,578 A * | 6/1995 | Kaya | G11C 16/16 365/185.29 |
| 5,909,397 A | 6/1999 | San | |
| 5,943,260 A | 8/1999 | Hirakawa | |
| 6,195,287 B1 | 2/2001 | Hirano | |
| 6,438,037 B1 | 8/2002 | Fastow | |
| 6,522,580 B2 * | 2/2003 | Chen | G11C 11/5621 365/185.02 |
| 6,525,964 B2 | 2/2003 | Tanaka | |
| 6,643,188 B2 | 11/2003 | Tanaka | |
| 6,735,114 B1 | 5/2004 | Hamilton | |
| 6,870,768 B2 | 3/2005 | Cernea | |
| 6,882,567 B1 | 4/2005 | Wong | |

(Continued)

FOREIGN PATENT DOCUMENTS

| | | |
|---|---|---|
| EP | 1729306 | 6/2006 |
| JP | 2004094987 | 3/2004 |

(Continued)

OTHER PUBLICATIONS

Response to Office Action dated Nov. 10, 2016, U.S. Appl. No. 14/926,167, Jan. 9, 2017.

(Continued)

*Primary Examiner* — Tuan T Nguyen
(74) *Attorney, Agent, or Firm* — Vierra Magen Marcus LLP

(57) ABSTRACT

Based on performance during programming, the non-volatile memory cells are classified as fast programming memory cells and slow programming memory cells (or other classifications). At a separate time for each programmed state, threshold voltage distributions are compacted based on the classification.

20 Claims, 24 Drawing Sheets

(56) References Cited

U.S. PATENT DOCUMENTS

| | | |
|---|---|---|
| 6,924,663 B2 | 8/2005 | Masui |
| 7,002,843 B2 | 2/2006 | Guterman |
| 7,016,226 B2 | 3/2006 | Shibata |
| 7,020,026 B2 | 3/2006 | Guterman |
| 7,023,733 B2 | 4/2006 | Guterman |
| 7,068,539 B2 | 6/2006 | Guterman |
| 7,088,621 B2 | 8/2006 | Guterman |
| 7,139,192 B1 | 11/2006 | Wong |
| 7,139,198 B2 | 11/2006 | Guterman |
| 7,158,421 B2 | 1/2007 | Li |
| 7,173,859 B2 | 2/2007 | Hemink |
| 7,177,199 B2 | 2/2007 | Chen |
| 7,243,275 B2 | 7/2007 | Gongwer |
| 7,280,408 B2 | 10/2007 | Guterman |
| 7,301,812 B2 | 11/2007 | Guterman |
| 7,301,817 B2 | 11/2007 | Li |
| 7,317,638 B2 | 1/2008 | Guterman |
| 7,349,264 B2 | 3/2008 | Mokhlesi |
| 7,411,827 B2 | 8/2008 | Guterman |
| 7,414,887 B2 | 8/2008 | Guterman |
| 7,447,075 B2 | 11/2008 | Guterman |
| 7,453,730 B2 | 11/2008 | Guterman |
| 7,460,406 B2 | 12/2008 | Mokhlesi |
| 7,596,031 B2 | 9/2009 | Hemink |
| 7,616,481 B2 | 11/2009 | Mokhlesi |
| 7,616,495 B2 | 11/2009 | Mokhlesi |
| 7,616,500 B2 | 11/2009 | Mokhlesi |
| 7,630,246 B2 | 12/2009 | Roohparvar |
| 7,764,542 B2 * | 7/2010 | Edahiro .............. G11C 16/3418 365/185.03 |
| 7,800,956 B2 | 9/2010 | Lee |
| 7,924,617 B2 | 4/2011 | Yip |
| 8,036,041 B2 | 10/2011 | Li |
| 8,064,252 B2 | 11/2011 | Yip |
| 8,111,548 B2 | 2/2012 | Mokhlesi |
| 8,144,512 B2 | 3/2012 | Huang |
| 8,174,895 B2 | 5/2012 | Chen |
| 8,184,479 B2 | 5/2012 | Lee |
| 8,233,324 B2 | 7/2012 | Sharon |
| 8,310,870 B2 | 11/2012 | Dutta |
| 8,321,727 B2 | 11/2012 | D'Abreu |
| 8,498,152 B2 | 7/2013 | Alrod |
| 8,509,000 B2 | 8/2013 | Sharon |
| 8,873,285 B2 | 10/2014 | Sharon |
| 2003/0147278 A1 | 8/2003 | Tanaka |
| 2004/0114437 A1 | 6/2004 | Li |
| 2005/0083735 A1 | 4/2005 | Chen |
| 2005/0162913 A1 | 7/2005 | Chen |
| 2008/0225599 A1 * | 9/2008 | Chae .................. G11C 11/5628 365/185.24 |
| 2008/0253181 A1 | 10/2008 | Edahiro |
| 2009/0213652 A1 | 8/2009 | Park |
| 2009/0323429 A1 | 12/2009 | Lee |
| 2010/0097861 A1 | 4/2010 | Dutta |
| 2012/0033500 A1 | 2/2012 | Dutta |
| 2013/0077409 A1 | 3/2013 | Shiino |
| 2015/0055411 A1 * | 2/2015 | Kim .................... G11C 11/5628 365/185.02 |

FOREIGN PATENT DOCUMENTS

| | | |
|---|---|---|
| WO | WO2007047283 | 4/2007 |
| WO | WO2010044993 | 4/2010 |

OTHER PUBLICATIONS

Office Action dated Dec. 22, 2016, U.S. Appl. No. 14/926,167.

Office Action dated Jul. 29, 2016, U.S. Appl. No. 14/926,167.

U.S. Appl. No. 14/926,167, "Natural Threshold voltage compaction with dual pulse program for non-volatile memory," filed Oct. 29, 2015.

PCT International Search Report dated Dec. 7, 2016, PCT Patent Application PCT/US2016/051363.

PCT Written Opinion of the International Searching Authroity dated Dec. 7, 2016, PCT Patent Application PCT/US2016/051363.

Response to Office Action dated Mar. 21, 2017, U.S. Appl. No. 14/926,167.

Office Action dated May 11, 2017, U.S. Appl. No. 14/926,167.

* cited by examiner

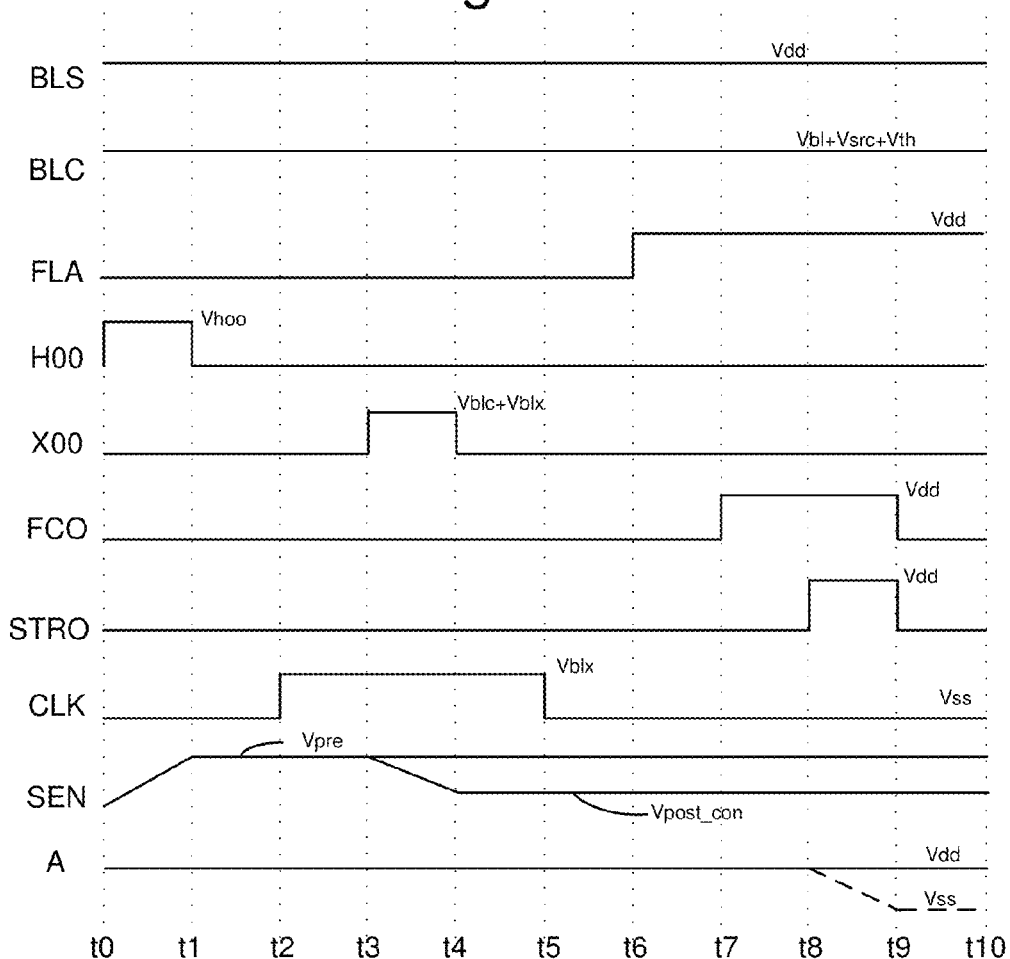
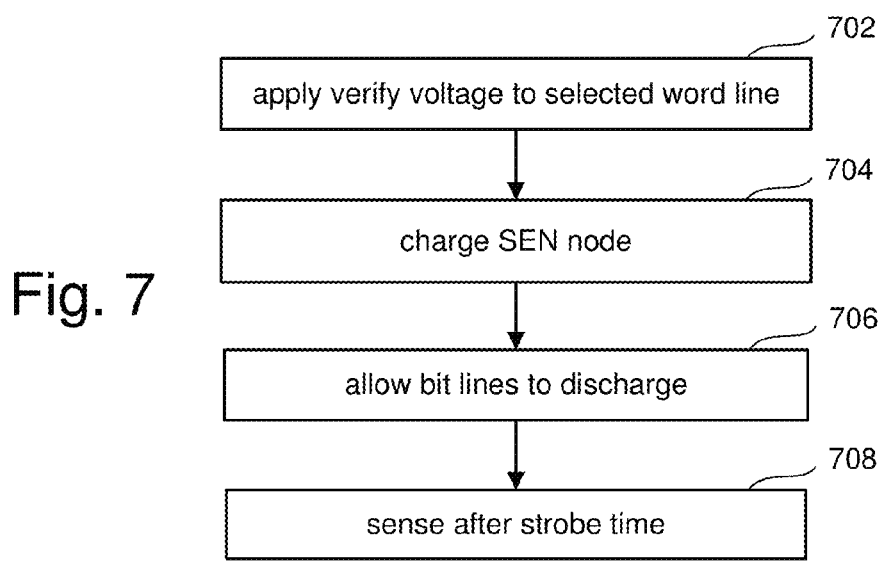

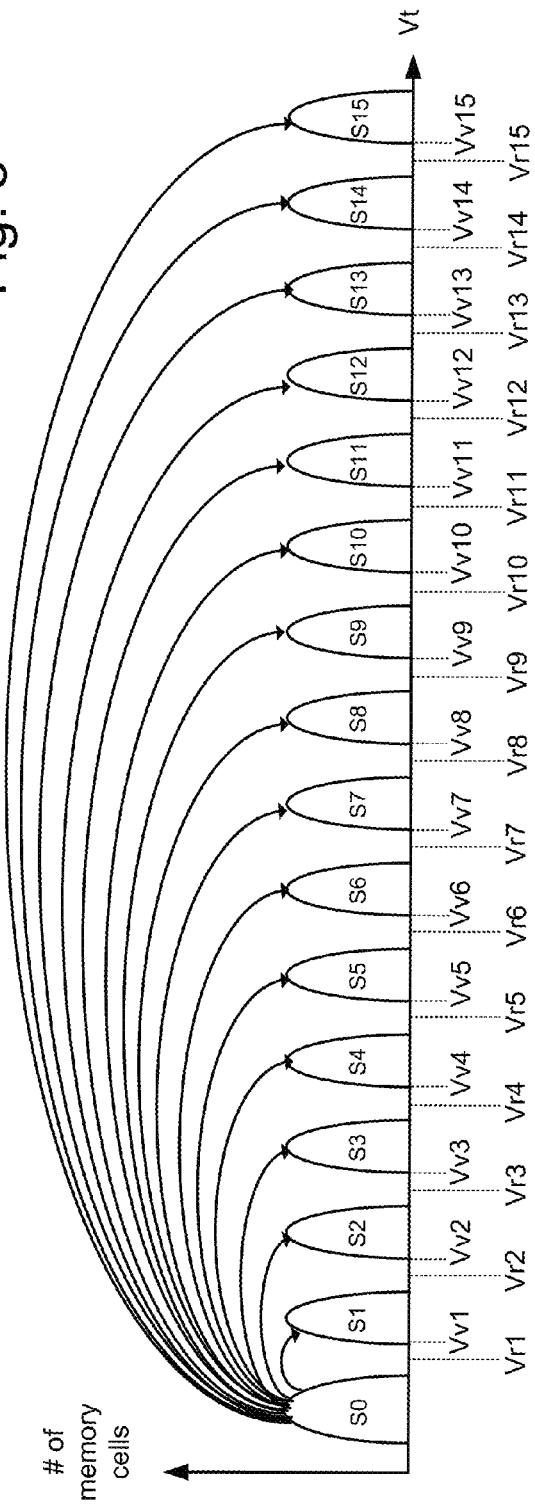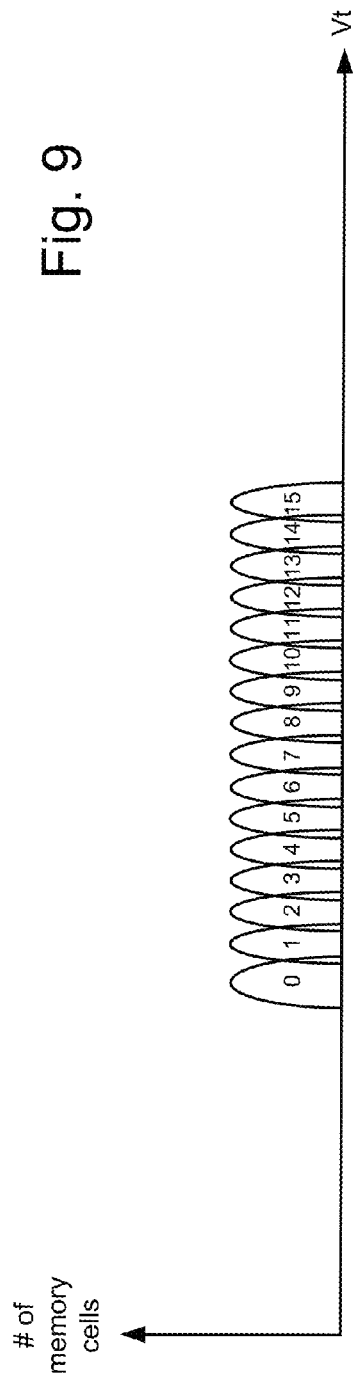

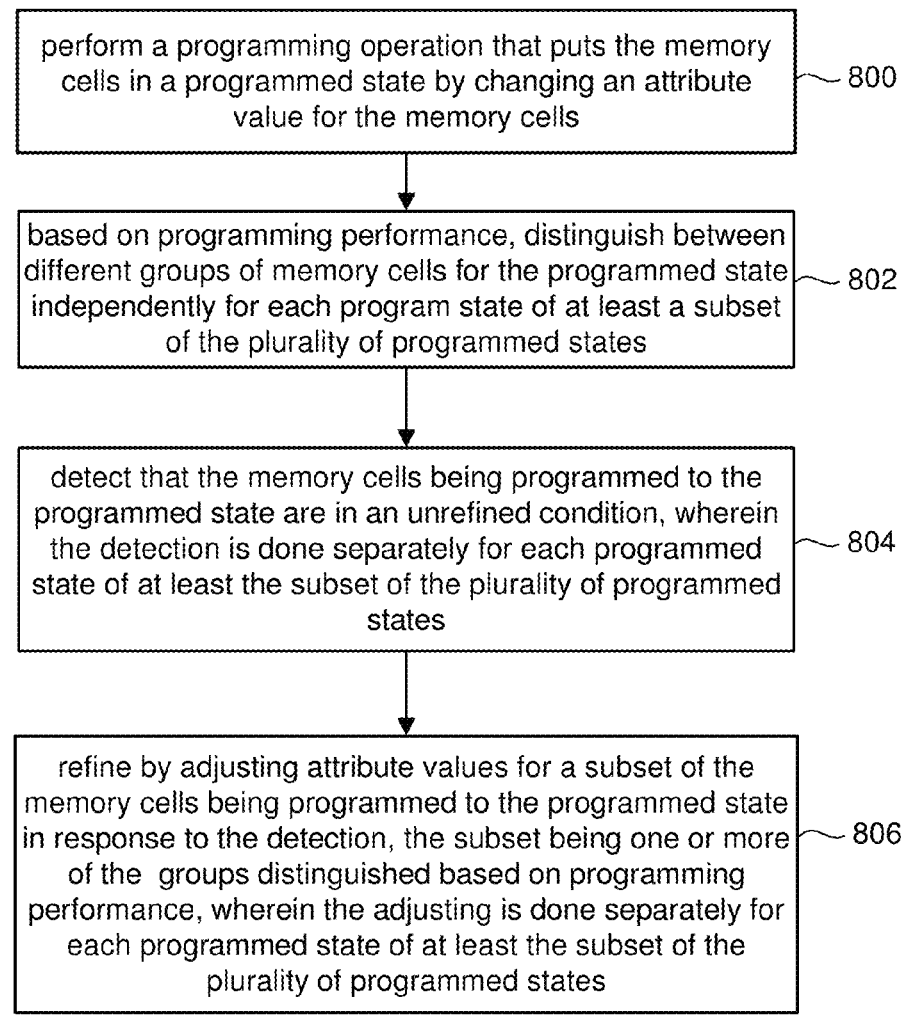
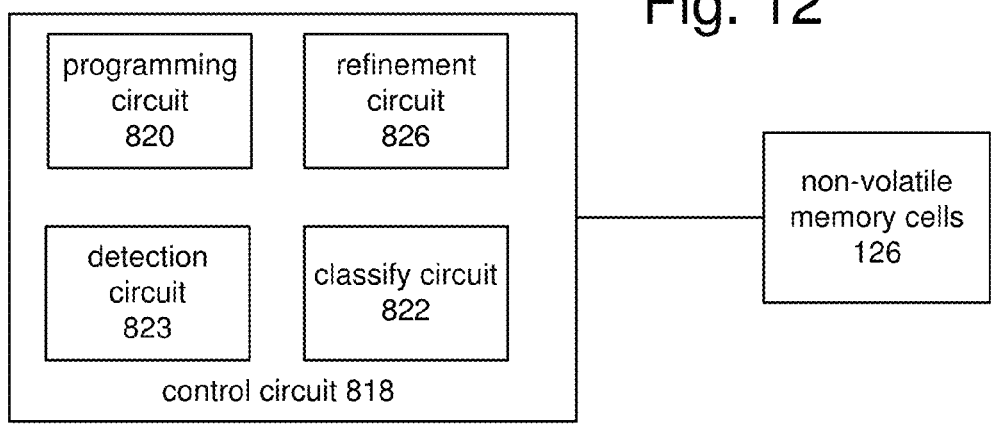

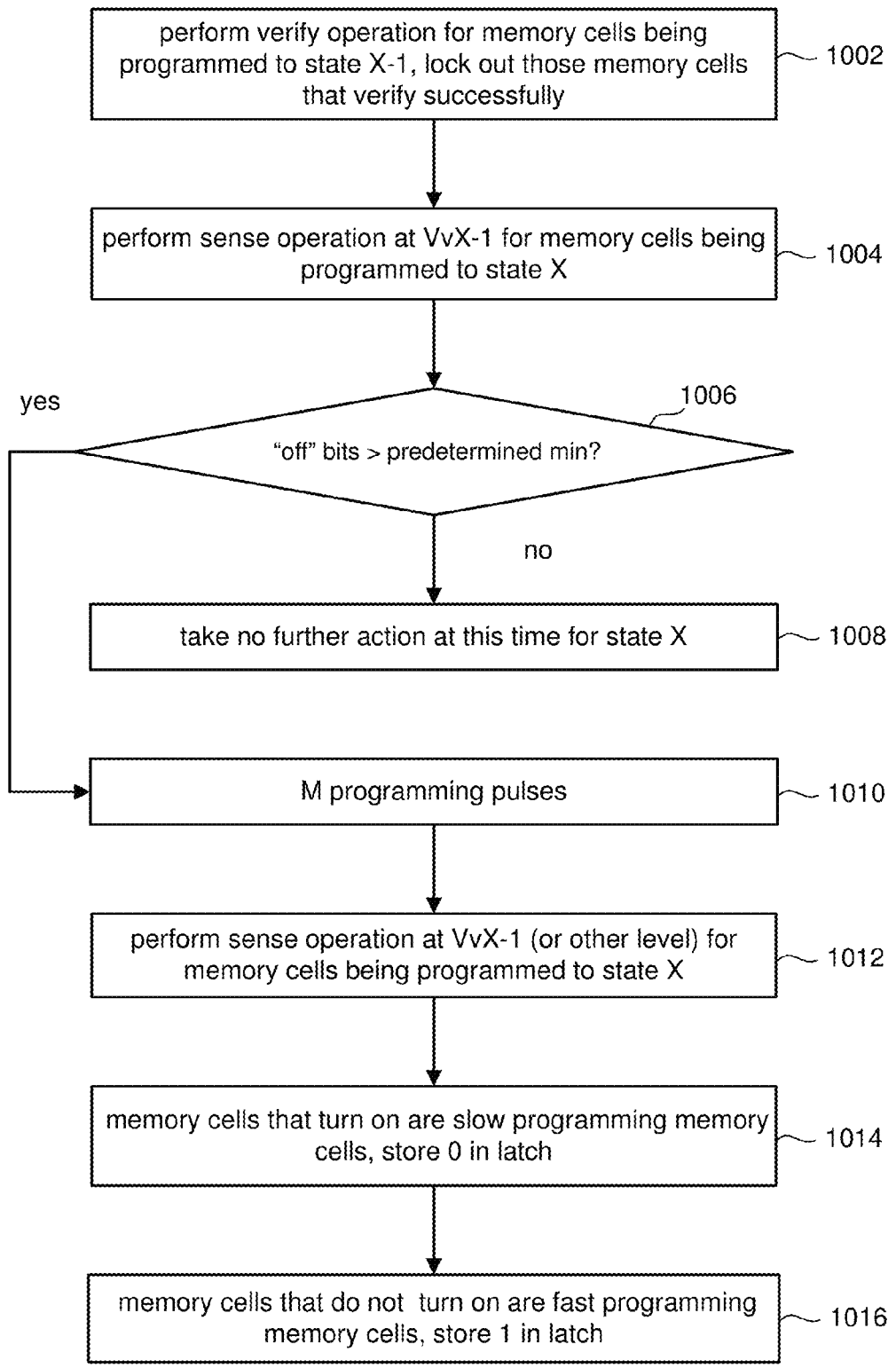

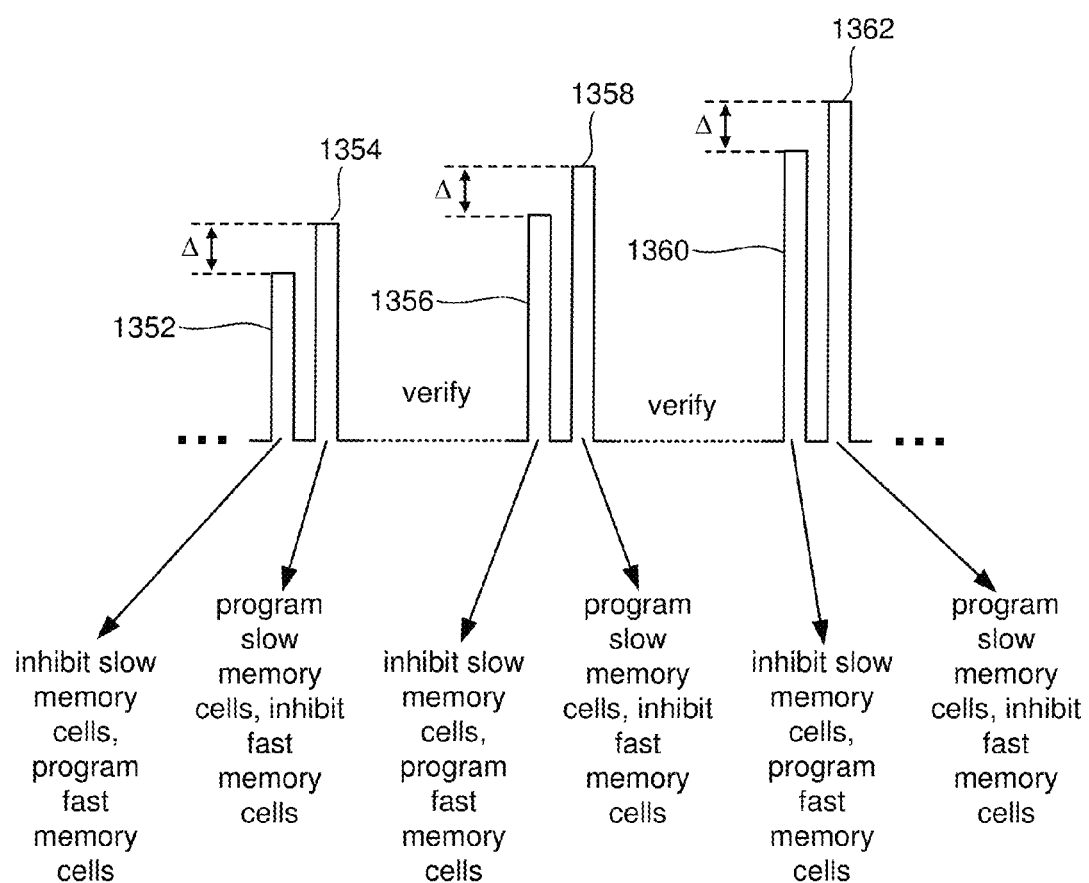

DYNAMIC THRESHOLD VOLTAGE COMPACTION FOR NON-VOLATILE MEMORY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state (or multi-level) non-volatile memory is implemented by identifying multiple, distinct allowed ranges of threshold voltages. Each distinct rang of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Application Publication No. 2004/0255090 both describe various data encoding schemes for multi-state flash memory cells. While multi-state non-volatile memory can store more data than binary non-volatile memory, the process for programming and verifying the programming can take longer for multi-state non-volatile memory.

BRIEF DESCRIPTION OF THE DRAWINGS

Like-numbered elements refer to common components in the different figures.

FIG. 6 is a timing diagram that describes the behavior of certain signals depicted in the sense amplifier of FIG. 5.

FIG. 7 is a flow chart describing one embodiment of the operation of the circuit of FIG. 5.

FIGS. 8 and 9 depict threshold voltage distributions.

FIG. 11 is a flow chart describing one embodiment of a process for dynamically compacting threshold voltage distributions.

FIG. 12 is a block diagram of one example set of components that can perform the process of FIG. 11.

FIG. 16C is a flow chart describing one embodiment of a process for classifying fast and slow programming memory cells.

FIG. 22 depicts sets of programming pulses.

DETAILED DESCRIPTION

In general, the more programmed states implemented in a multi-state non-volatile memory, the longer it takes to verify programming Therefore, technology is disclosed for reducing the time needed to verify programming for multi-state non-volatile memory. One embodiment comprises non-volatile memory cells configured to have an attribute value representative of one programmed state of a plurality of programmed states and a control circuit in communication with the memory cells. The control circuit performs a programming operation that puts the memory cells in a programmed state by changing the attribute value for the memory cells. The control circuit also detects that the memory cells being programmed to the programmed state are ready to be refined and adjusts attribute values for a subset of the memory cells in response to the detection. In some implementations, the above-mentioned detecting and adjusting attribute values can be performed independently for each programmed state (or a subset of programmed states).

In one embodiment, when memory cells store multiple bits of data representing multiple programmed states, a verification process that verifies all possible programmed states can take a long time. Therefore, some systems will only verify for a subset of programmed states that the memory cells could potentially be achieving. In some embodiment, the number of programmed states being verified at a given time depends on the width of the natural threshold voltage distribution, which is the distribution of threshold voltages for a population of memory cells after some amount of programming but before the memory cells are locked out from programming, artificially slowed down, or artificially sped up. It is proposed to reduce the amount of time needed to verify by reducing the width of the natural threshold voltage distribution so that less programmed states need to be verified at a given time. One example implementation for reducing the width of the threshold voltage distribution is to classify the non-volatile memory cells as fast programming memory cells and slow programming memory cells (or other classifications) based on performance during programming (or some other attributes). This classification can be performed separately for different programmed states. Threshold voltage distributions are then compacted based on the classification. In some examples, the compaction is performed separately for each programmed state. This process can be used to achieve other goals in addition to or instead of narrowing threshold voltage distributions during programming.

Figure 1:
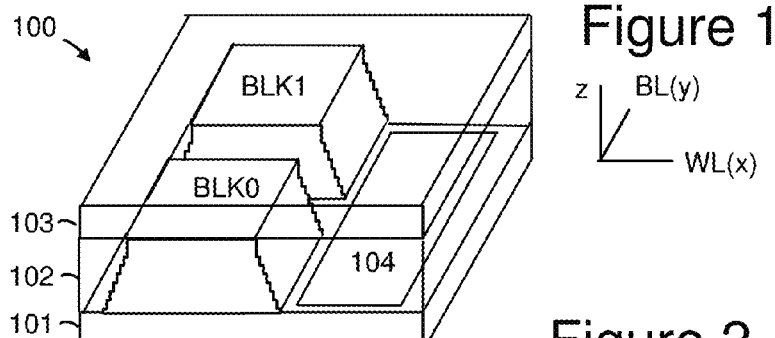
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
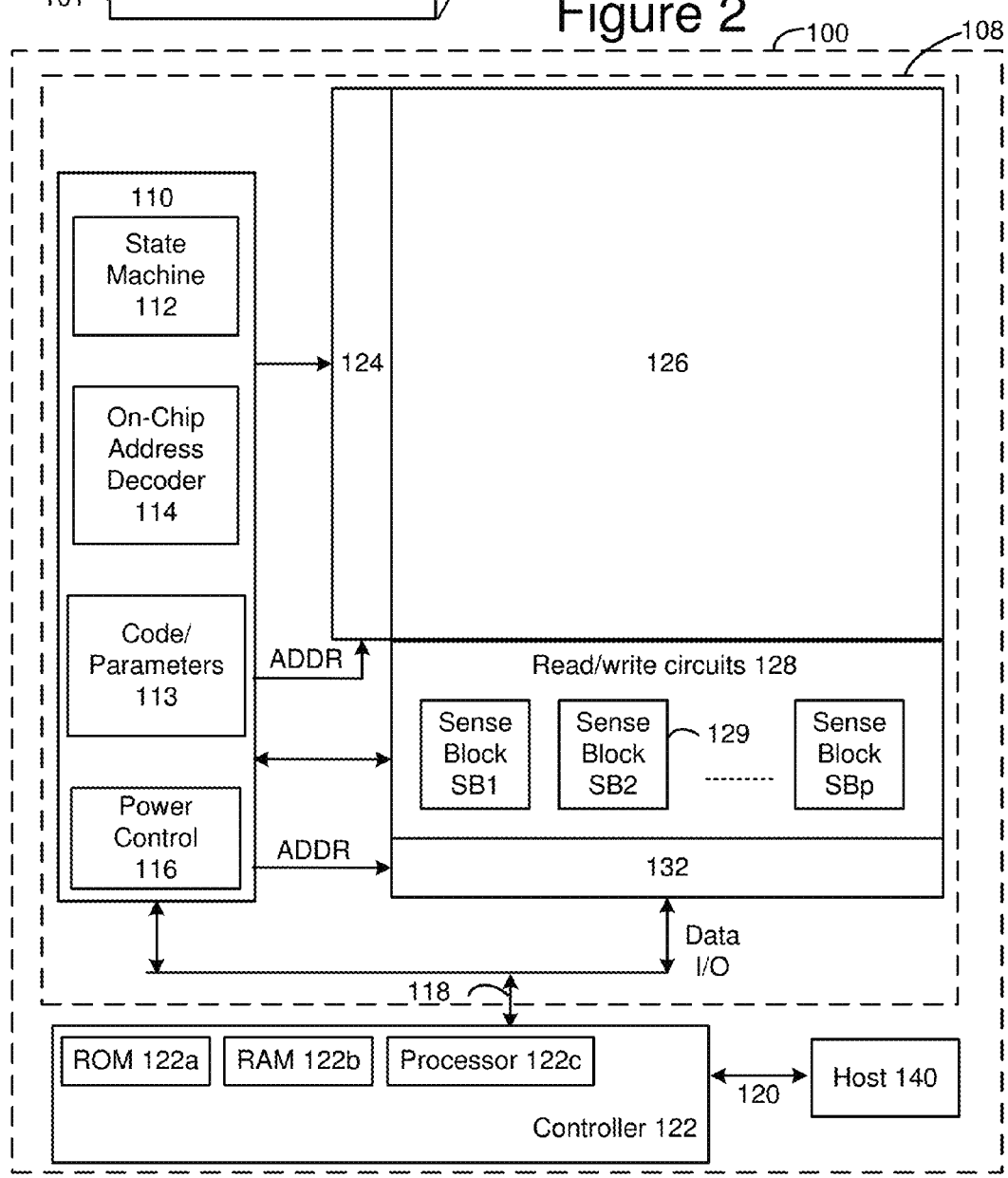
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used.

Memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 can be considered a control circuit that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

The technology described herein can also be utilized with technologies in addition to the charge trapping and floating gate flash memory described above. In addition to flash memory (e.g., 2D and 3D NAND-type and NOR-type flash memory), examples of non-volatile memory include ReRAM memories, magnetoresistive memory (e.g., MRAM), and phase change memory (e.g., PCRAM).

One example of a ReRAM memory includes reversible resistance-switching elements arranged in cross point arrays accessed by X lines and Y lines (e.g., word lines and bit lines). Programming can be supplied by a series of voltage pulses (ie doses of programming) on the word lines. Memory cells can be inhibited by applying a large enough voltage on the corresponding bit lines to prevent a sufficient voltage differential across the memory cell.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Applying appropriate temperatures (over discrete periods of time—doses) can be used to program. Similarly, adjusting temperature can be used to inhibit. In some implementations, temperatures are controlled by applying voltages and/or currents to the memory cells and/or surrounding components.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created (ie the dose of programming) This approach requires a fairly substantial current to generate the field. Therefore, the programming is applied as a unit of current. Sufficiently reducing or removing the current can be used to inhibit programming.

Phase change memory (PCRAM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that this technology is not limited to a single specific memory structure, but covers many relevant memory structures within the spirit and scope of the technology as described herein and as understood by one of ordinary skill in the art.

Figure 3A:
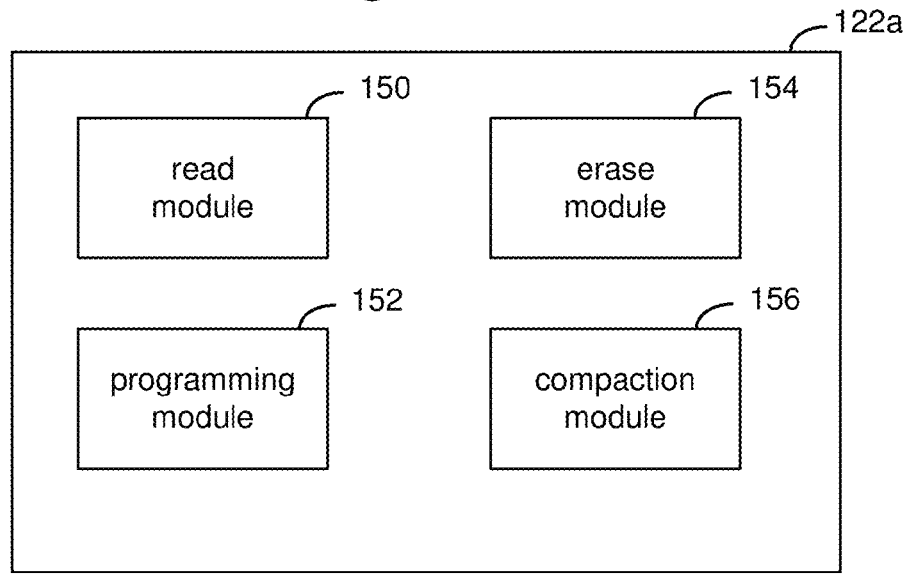
FIG. 3A is a block diagram depicting software modules for programming one or more processors in a Controller.

FIG. 3A is a block diagram depicting software modules for programming one or more processors in controller 122. FIG. 3A depicts read module 150, programming module 152, erase module 154 and compaction module 156 being stored in ROM 122a. These software modules can also be stored in RAM or memory die 108. Read module 150 includes software that programs processor(s) 122C to perform read operations. Programming module 152 includes software that programs processor(s) 122C to perform programming operations (including verification of programming) Erase module 154 includes software that programs processor(s) 122C to perform erase operations. Compaction module 156 includes software that programs processor(s) 122C to perform the classifying, detecting and compacting described below. Based on the software, controller 122 instructs memory die 108 to perform memory operations.

Figure 3B:
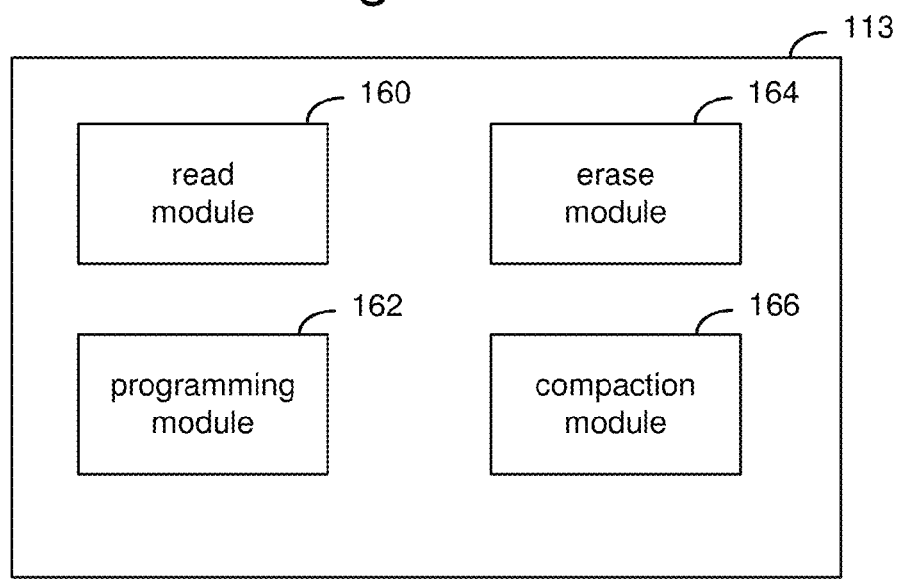
FIG. 3B is a block diagram depicting software modules for programming a state machine or other processor on a memory die.

FIG. 3B is a block diagram depicting software modules for programming state machine 112 (or other processor on memory die 108). FIG. 3B depicts read module 160, programming module 162, erase module 164 and compaction module 166 being stored in code and parameter storage 113. These software modules can also be stored in RAM or in memory structure 126. Read module 160 includes software that programs state machine 112 to perform read operations. Programming module 152 includes software that programs state machine 112 to perform programming operations (including verification of programming) Erase module 154 includes software that programs state machine 112 to perform erase operations. Compaction module 166 includes software that programs state machine 112 to perform the classifying, detecting and compacting described below. Alternatively, state machine 112 (which is an electronic circuit) can be completely implemented with hardware so that no software is needed to perform these functions.

Figure 3C:
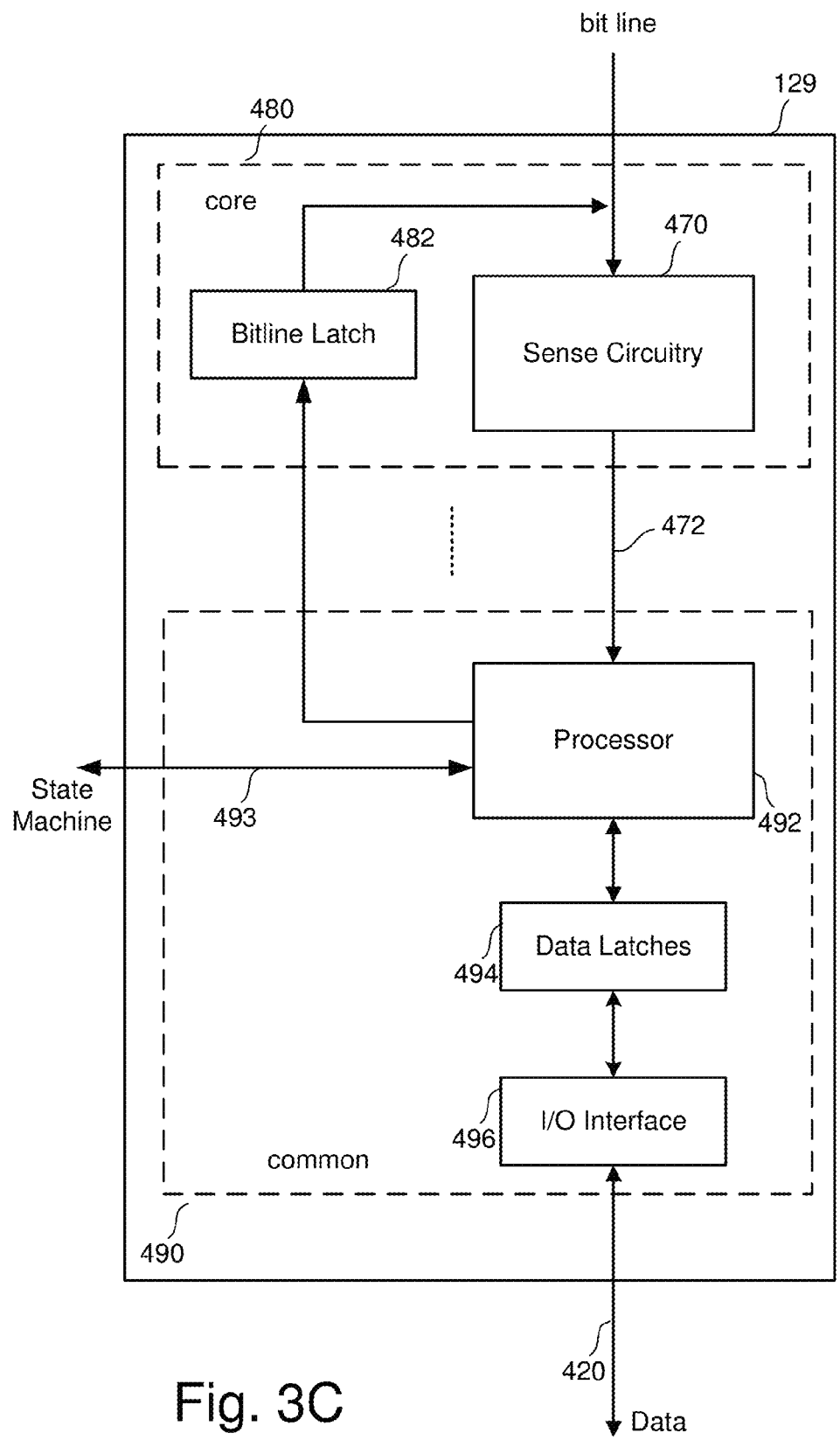
FIG. 3C is a block diagram of an individual sense block.

FIG. 3C is a block diagram of an individual sense block 129 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 112 that controls the supply of different voltages to the addressed memory cell. As it steps through the various predefined voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 3C) such that each of the output lines is wired-OR' d together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 4A:
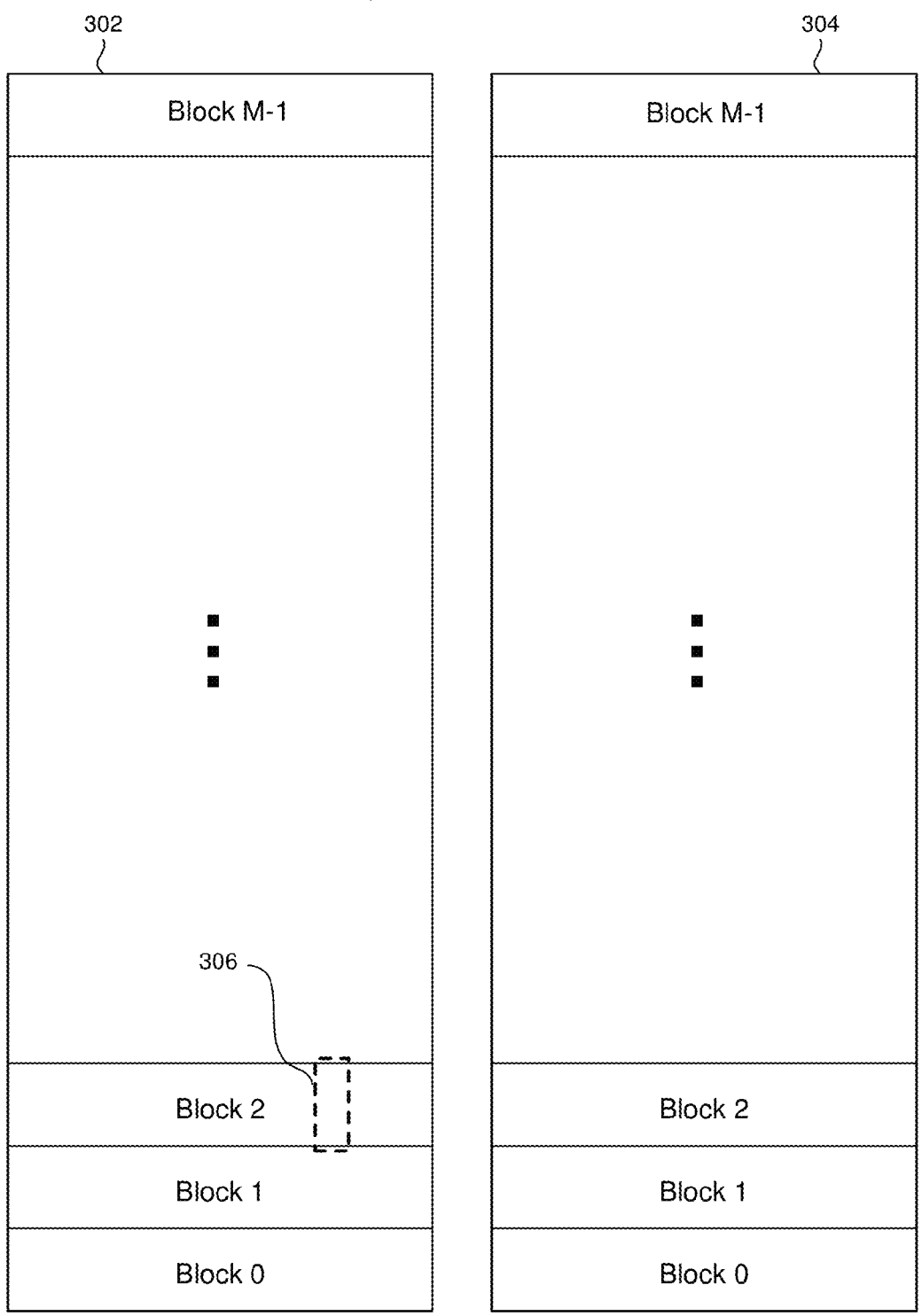
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
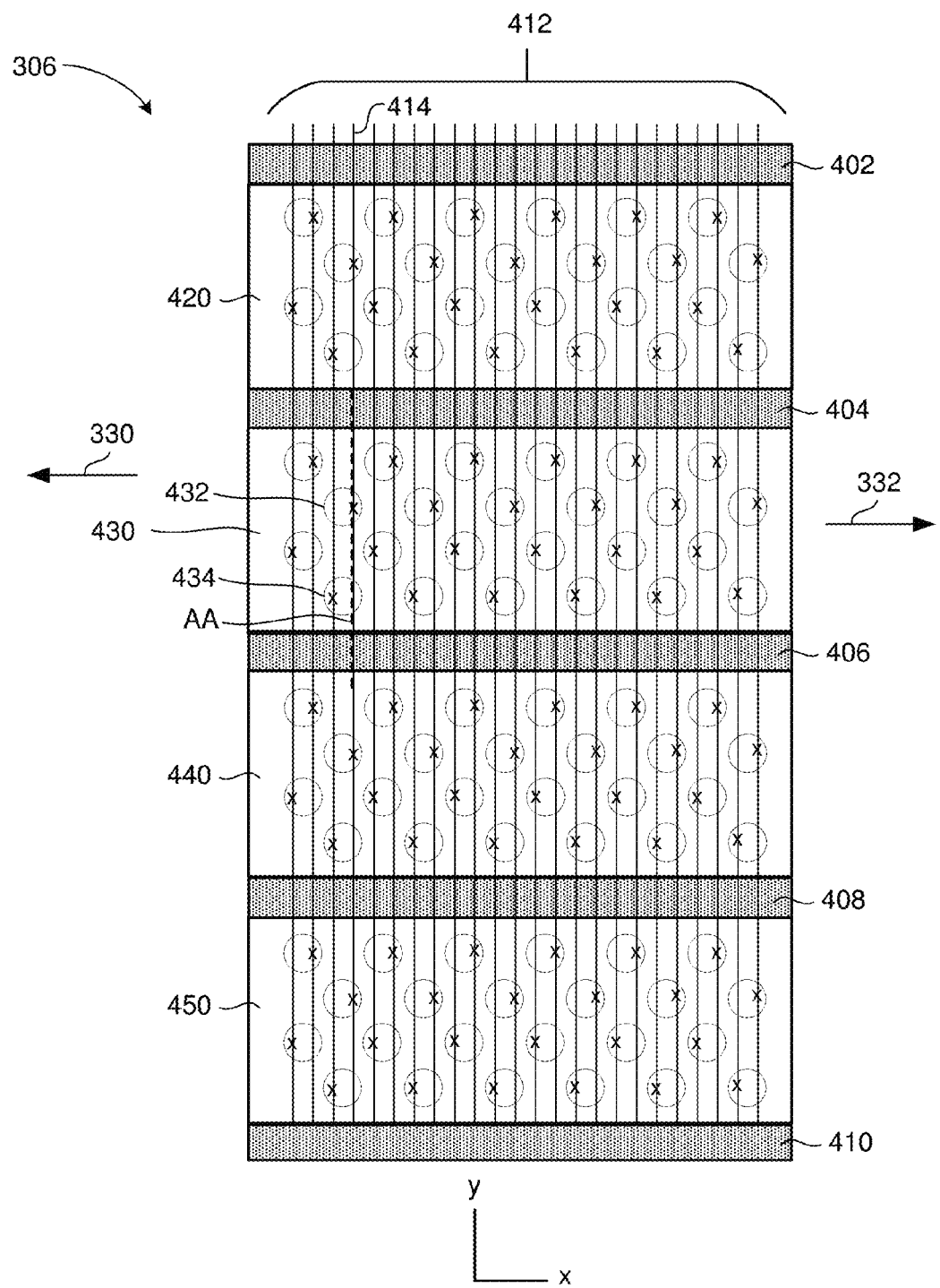
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 48 layers. Other embodiments have less than or more than 48 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
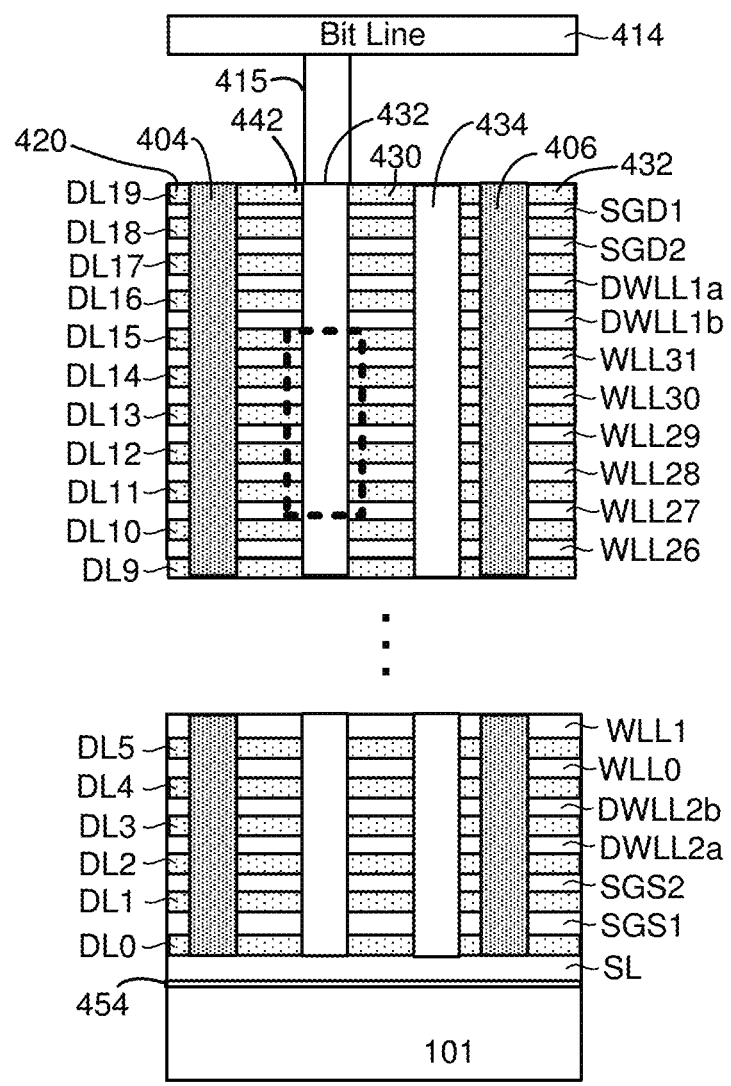
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes two drain side select layers SGD1 and SGD2; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD1 and SGD2; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DLO-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed Drain side select layers SGD1 and SGD2 are used to electrically connect and disconnect NAND strings from bit lines. Source side select layers SGS1 and SGS2 are used to electrically connect and disconnect NAND strings from the source line SL.

Figure 4D:
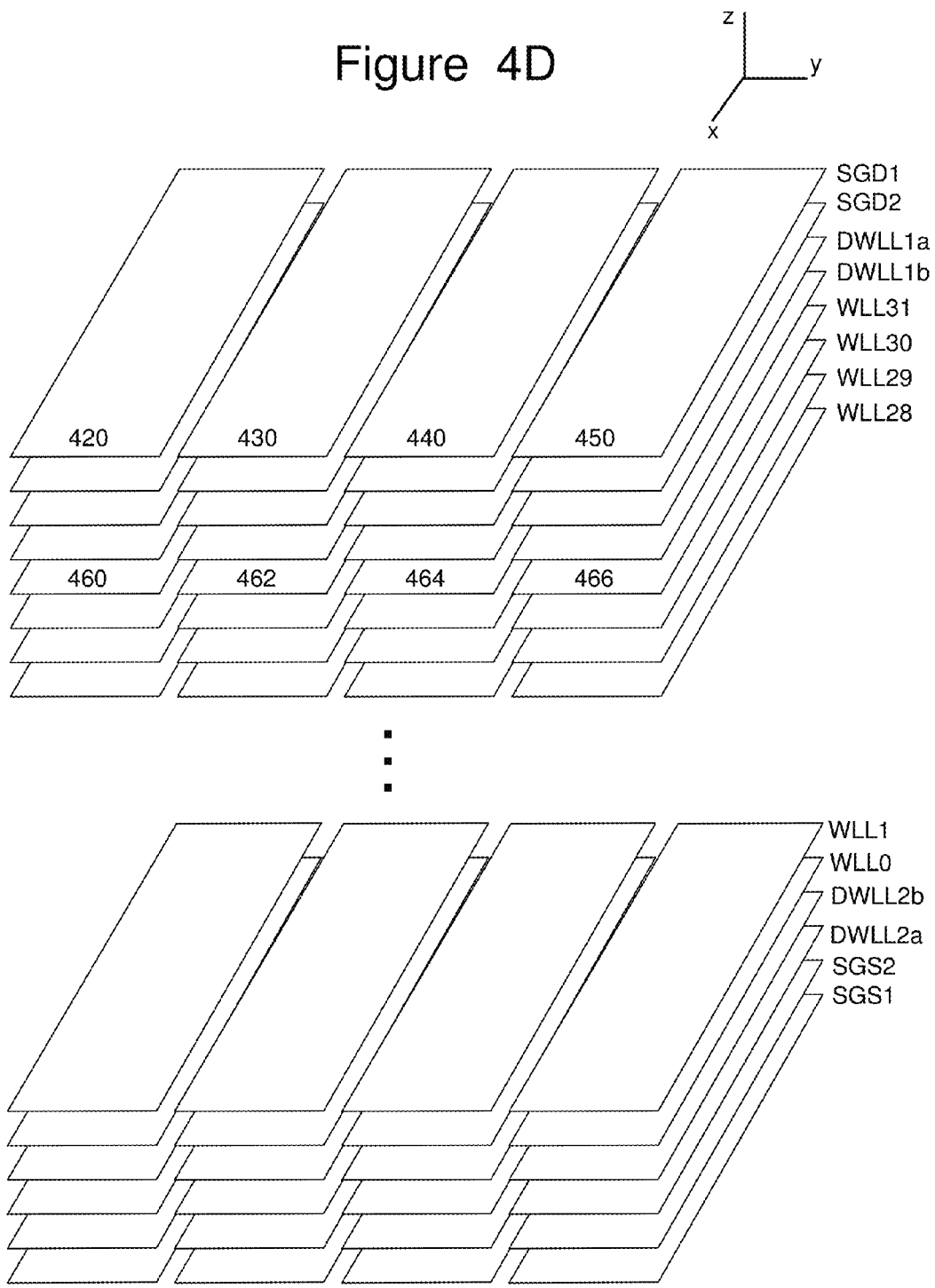
FIG. 4D depicts a view of the select gate layers and word line layers.

FIG. 4D depicts a perspective view of the conductive layers (SGD1, SGD2, SGS1, SGS2; DWLL1a, DWLL1b, DWLL2a, DWLL2b, and WLL0-WLL31) for the block that is partially depicted in FIG. 4C. As mentioned above with respect to FIG. 4B, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4E:
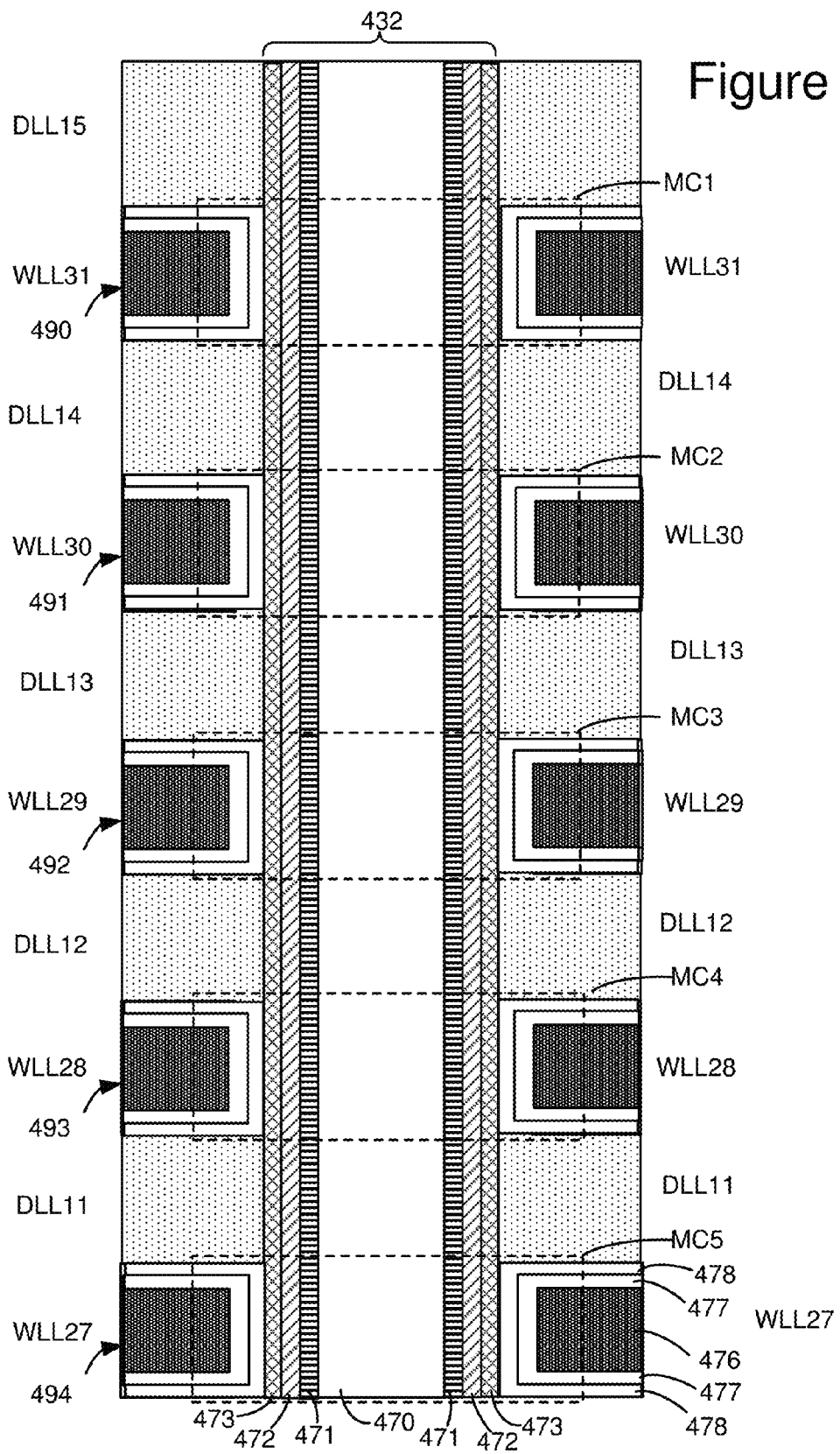
FIG. 4E is a cross sectional view of a vertical column of memory cells.

FIG. 4E depicts a cross sectional view of region 442 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO$_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4E depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage (Vth) of a memory cell is increased in proportion to the amount of stored charge. During an erase operation, the electrons return to the channel or holes recombine with electrons.

Figure 5:
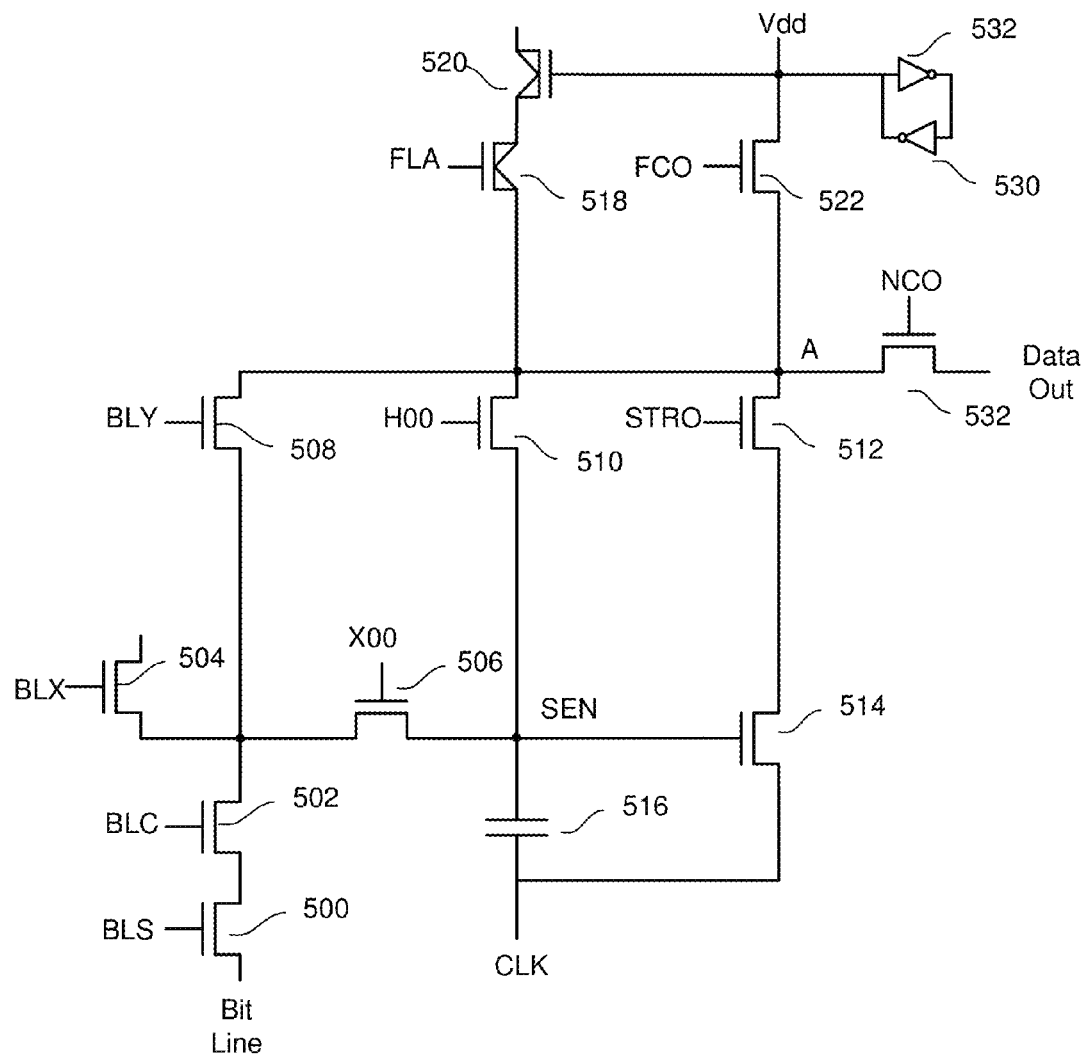
FIG. 5 is a schematic diagram of a sense amplifier.

FIG. 5 is a schematic diagram depicting a sense amplifier circuit. Each sense block SB1, SB2, . . . , SBp (see FIG. 2) would include multiple sense amplifier circuits (e.g., sense circuitry 470). As described below, the circuit of FIG. 5 will pre-charge a capacitor (or other charge storage device) to a pre-charge magnitude, discharge the capacitor through the memory cell for a strobe time, and sense voltage at the capacitor after the strobe time. The sense voltage will be indicative of whether the memory cells conducted the current being sensed for, which is indicative of whether the threshold voltage of the memory cell is greater than or less than threshold voltage being tested for (corresponding to the control gate voltage). If the threshold voltage of the memory cell is greater than the threshold voltage being tested, then, during a verify operation, the memory cell will complete programming, as appropriate based on the processes described herein. FIG. 5 shows transistor 500 connected to the Bit Line and transistor 502. Transistor 500 receives the signal BLS at its gate, and is used to connect to or isolate the Bit Line. Transistor 502 receives the signal BLC at its gate, and is used as a voltage clamp. The gate voltage BLC is biased at a constant voltage equal to the desired Bit Line voltage plus the threshold voltage of transistor 502. The function of transistor 502, therefore, is to maintain a constant Bit Line voltage during a sensing operation (during read or verify), even if the current through the Bit Line changes.

Transistor 502 is connected to transistors 504, 506 and 508. Transistor 506 is connected to capacitor 516 at the node marked SEN. The purpose of transistor 506 is to connect capacitor 516 to Bit Line 500 and disconnect capacitor 516 from Bit Line 500 so that capacitor 516 is in selective communication with Bit Line 500. In other words, transistor 506 regulates the strobe time. That is, while transistor 506 is turned on capacitor 516 can discharge through the Bit Line, and when transistor 506 is turned off capacitor 516 cannot discharge through the Bit Line.

The node at which transistor 506 connects to capacitor 516 is also connected to transistor 510 and transistor 514. Transistor 510 is connected to transistors 508, 512 and 518. Transistor 518 is also connected to transistor 520. Transistors 518 and 520 are PMOS transistors while the other transistors of FIG. 5 are NMOS transistors. Transistors 510, 518, and 520 provide a pre-charging path to capacitor 516. A voltage (e.g. Vdd or other voltage) is applied to the source of transistor 520. By appropriately biasing transistors 510, 518 and 520, the voltage applied to the source of transistor 520 can be used to pre-charge capacitor 516. After pre-charging, capacitor 516 can discharge through the Bit Line via transistor 506 (assuming that transistors 500 and 502 are conducting).

The circuit of FIG. 5 includes inverters 530 and 532 forming a latch circuit. The output of inverter 532 is connected to the input of inverter 530 and the output of inverter 530 is connected to the input of inverter 532 as well as transistors 520 and 522. The input of inverter 532 will receive Vdd and the two inverters 530, 532 will act as a latch to store Vdd. The input of inverter 532 can also be connected to another value. Transistors 512 and 522 provide a path for communicating the data stored by inverters 530 and 532 to transistor 514. Transistor 522 receives the signal FCO at its gate. Transistor 512 receives the signal STRO at its gate. By raising or lowering FCO and STRO, a path is provided or cut off between the inverters 530, 532 and transistor (sensing switch) 514. The gate of transistor 514 is connected capacitor 516, transistor 506 and transistor 510 at the node marked SEN. The other end of capacitor 516 is connected to the signal CLK.

As discussed above, capacitor 516 is pre-charged via transistors 510, 518 and 520. This will raise the voltage at the SEN node to a pre-charge voltage level (Vpre). When transistor 506 turns on, capacitor 516 can discharge its charge through the Bit Line and the selected memory cell if the threshold voltage of the memory cell is below the voltage level being tested for. If the capacitor 516 is able to discharge, then the voltage at the capacitor (at the SEN node) will decrease.

The pre-charge voltage (Vpre) at the SEN node is greater than the threshold voltage of transistor 914; therefore, prior to the strobe time, transistor 514 is on (conducting). Since transistor 514 is on during the strobe time, then transistor 512 should be off. If the capacitor does not discharge during the strobe time, then the voltage at the SEN node will remain above the threshold voltage of transistor 514 and the charge at the inverters 530, 532 can be discharged into the CLK signal when STRO turns on transistor 512. If the capacitor discharges sufficiently during the strobe time, then the voltage at the SEN node will decrease below the threshold voltage of transistor 514; thereby, turning off transistor 914 and the data (e.g., Vdd) stored at inverters 530, 532 from being discharged through CLK. So testing whether the diodes 530, 532 maintain their charge or discharge will indicate the result of the verification process. In one embodiment, the result can be read at node A via transistor 534 (Data Out) by turning on transistor 534 gate signal NCO.

The pre-charge level of capacitor 516 (and, thus, the pre-charge voltage at node SEN) is limited by the current passing through transistor 510. The current that passes through transistor 510 is limited by the gate voltage H00. As such, the pre-charge voltage at node SEN is limited by the voltage H00 less the threshold voltage of transistor 510. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging.

When the system performs a read or verify operation (both are sense operations), the voltage applied to the control gate of the cell may cause the channel (connected to the bit line) of the cell to conduct. If this happens, a capacitor is discharged through the channel, lowering in voltage as it discharges.

FIG. 6 is a timing diagram describing the behavior of various signals from FIG. 5. The signal BLS is at Vdd the entire time depicted and the signal BLC is at Vb1+Vsrc+Vth, where Vb1 is the voltage of the Bit Line, Vsrc is the voltage of the source line and Vth is the threshold voltage of transistor 502. The signal FLA starts at Vss at t0 and goes to Vdd at t6. When the signal FLA is at Vss, the pre-charging path is regulated by transistor 510. At t0, the voltage of H00 is raised from ground to a pre-charge level. The raising of the voltage at H00 turns on transistor 510 and opens up the pre-charge path. The magnitude of the voltage at H00 is set. FIG. 6 shows H00 going to Vhoo. The signal H00 will stay at the pre-charge voltage (Vhoo) until time t1. While H00 is high, transistor 510 turns on and capacitor 516 will pre-charge between t0 and t1, as depicted by the voltage at SEN. At time t1, H00 is brought down to Vss and the pre-charging is completed.

The signal X00 is used to allow capacitor 516 to be in communication with the Bit Line so that the capacitor can discharge through the Bit Line and selected memory cell. At time t3, X00 is raised to Vb1c+Vb1x, where Vb1c is the voltage of the signal BLC and Vb1x is the voltage of the signal BLX (both discussed above). At time t4, the voltage at X00 is lowered to Vss. Between times t3 and t4, known as the strobe time, capacitor 516 will be in communication with the Bit Line in order to allow it to discharge through the Bit Line and the selected memory cell (depending on the threshold voltage of the selected memory cell). The signal CLK is raised to Vb1x at time t2 and lowered back down to Vss at time t5 to prevent any fighting conditions in the circuit and to allow proper discharge of capacitor 516.

As discussed above, because H00 is raised between t0 and t1, capacitor 516 (and SEN node) will charge up between t0 and t1 (the pre-charge). This is depicted in FIG. 6 with the SEN node charging from Vss to Vpre. The solid line for Vpre represents an example pre-charging of the node SEN (and capacitor 516) in response to Vh00 being applied to the gate of transistor 510.

When X00 is raised up at t3, capacitor 516 can initially pre-charge the bit line and then discharge through the Bit Line (if the threshold voltage is at the appropriate level). As depicted in FIG. 6 between t3 and t4, the voltage at the SEN node can will dissipate from Vpre to Vpost_con if the memory cell turns on (conducts) because its threshold voltage is less than or equal to the voltage being applied to its control gate. If the threshold voltage for the memory cell being tested is higher than the voltage applied to its control gate, capacitor 516 will not discharge and the voltage will remain at Vpre. The period between t3 and t4 is the strobe time and can be adjusted, as described above.

FIG. 6 shows that the signal FCO is raised to Vdd at t7 and lowered to Vss at T9. The signal STRO is raised to Vdd at t8 and lowered at t9. Between times t8 and t9, there is a path between the inverters 530, 532 and transistor 514. If the voltage at the node SEN is greater than the threshold voltage of transistor 514, then there will be a path from the inverters 530, 532 to CLK and the data at the inverters 530, 532 will dissipate through the signal CLK and through the transistor 514. If the voltage at the node SEN is lower than threshold voltage of transistor 514 (e.g. if the capacitor discharged), then transistor 514 will turn off and the voltage stored by the inverters 530, 532 will not dissipate into CLK. FIG. 6 shows the voltage level at node A at Vdd. If the voltage of the capacitor does not dissipate (e.g., due to not enough current flowing because the threshold voltage of the selected memory cell is greater than the voltage being tested for), then transistor 514 will remain on and the voltage at node A will dissipate to Vss (as depicted by the dashed line). If the voltage of the capacitor does dissipate (e.g., due to sufficient current flowing because the threshold voltage of the selected memory cell is below the voltage being tested for), then transistor 514 will turn off and the voltage at node A will remain at Vdd (as depicted by the solid line). The output of node A is provided to the Data Out signal via transistor 534 by applying Vdd to the signal NCO.

FIG. 7 is a flow chart describing a sensing operation performed according to the timing diagram of FIG. 6. In step 702, the appropriate verify reference voltage (e.g., Vv1, Vv2, Vv3, Vv4, Vv5, Vv6, Vv7, Vv8, Vv9, Vv10, Vv11, Vv12, Vv13, Vv14 or Vv15—see FIG. 8) is applied to the selected word line. The selected word line is connected to the memory cells being programmed and verified. The bit lines connected to the memory cells being programmed and verified are charged to a pre-determined pre-charge level. In step 704, all of the SEN nodes are pre-charged. In step 706, the bit lines are allowed to discharge, for example, by discharging the capacitor 516 (see t5-t6 of FIG. 6). After a predetermined time period, referred to as the "strobe time" or "integration time" the voltage of the capacitor 516 (or the SEN node) is sampled as described above to see whether the respective memory cell(s) conducted in step 708. As described above, the verification process is performed simultaneously for thousands of memory cells connected to the same word line and different bit lines.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores four bits of data. Other embodiments, however, may use other data capacities per memory cell (e.g., such as one, two, three, or five bits of data per memory cell). FIG. 8 shows sixteen threshold voltage distributions, corresponding to sixteen data states. The first threshold voltage distribution (data state) S0 represents memory cells that are erased. The other fifteen threshold voltage distributions (data states) S1-S15 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring physical state, only one bit will be affected. Note that state N−1 is an adjacent lower data state for state N; for example, state 7 is an adjacent lower data state for state 8.

FIG. 8 also shows fifteen read reference voltages, Vr1, Vr2, Vr3, Vr4, Vr5, Vr6, Vr7, Vr8, Vr9, Vr10, Vr11, Vr12, Vr13, Vr14 and Vr15, for reading data from memory cells. By testing whether the threshold voltage of a given memory cell is above or below the fifteen read reference voltages, the system can determine what data state (i.e., S0, S1, S2, S3, . . . ) the memory cell is in.

FIG. 8 also shows fifteen verify reference voltages, Vv1, Vv2, Vv3, Vv4, Vv5, Vv6, Vv7, Vv8, Vv9, Vv10, Vv11, Vv12, Vv13, Vv14 and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7. When programming memory cells to data state S8, the system will test whether those memory cells have a threshold voltage greater than or equal to Vv8. When programming memory cells to data state S9, the system will test whether those memory cells have a threshold voltage greater than or equal to Vv9. When programming memory cells to data state S10, the system will test whether those memory cells have a threshold voltage greater than or equal to Vv10. When programming memory cells to data state S11, the system will test whether those memory cells have a threshold voltage greater than or equal to Vv11. When programming memory cells to data state S12, the system will test whether those memory cells have a threshold voltage greater than or equal to Vv12. When programming memory cells to data state S13, the system will test whether those memory cells have a threshold voltage greater than or equal to Vv13. When programming memory cells to data state S14, the system will test whether those memory cells have a threshold voltage greater than or equal to Vv14. When programming memory cells to data state S15, the system will test whether those memory cells have a threshold voltage greater than or equal to Vv15.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14 and/or S15. For example, while some memory cells are being programmed from data state S0 to data state S1, other memory cells are being programmed from data state S0 to data state S2 and/or from data state S0 to data state S3, and so on. The arrows of FIG. 8 represent the full sequence programming. The technology described herein can also be used with other types of programming in addition to full sequence programming (including, but not limited to, multiple stage/phase programming).

FIG. 9 illustrates that another embodiment of threshold voltage distributions corresponding to data states S0-S15 that can partially overlap since the error correction can handle a certain percentage of memory cells that are in error. Because of the size of the drawing, the references to the data states have been truncated such that 0 is used rather than S0, 1 is used rather than S1, 2 is used rather than S2, and so on.

Figure 10:
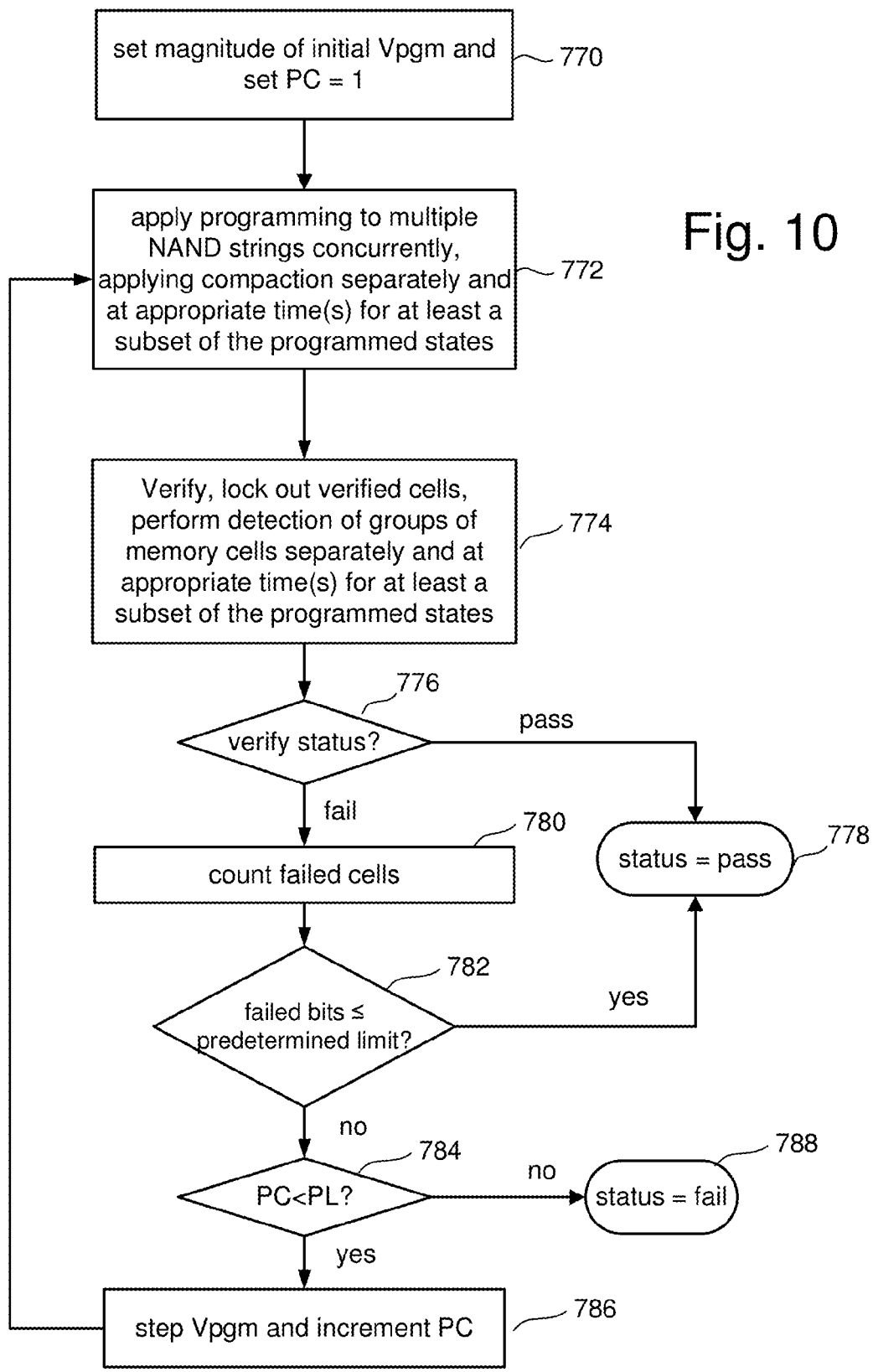
FIG. 10 is a flow chart describing one embodiment of a process for programming.

FIG. 10 is a flow chart describing one embodiment of a process for performing programming on memory cells connected to a common word line to one or more targets (e.g., also known as data states, programmed states or threshold voltage ranges). The process of FIG. 10 can be performed one or multiple times to program data to a set of memory cells. For example, the process of FIG. 10 can be used to program memory cells from S0 to any of programmed states S1-S15 in the full sequence programming of FIG. 8. The process of FIG. 10 can be used to program memory cells for any of the phases of a multi-phase programming process known in the art.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 770 of FIG. 10, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming), so that it is applied to multiple NAND strings. In one embodiment, the group of memory cells being programmed concurrently are all connected to the same word line (the selected word line). The unselected word lines receive one or more boosting voltages (e.g., ~7-11 volts) to perform boosting schemes known in the art. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming Additionally, step 772 includes applying compaction separately and at appropriate time(s) for at least a subset of the programmed states, as described in more detail below.

In step 774, the appropriate memory cells are verified using the appropriate set of target levels to perform one or more verify operations. In one embodiment, the verification process is performed by testing whether the threshold voltages of the memory cells selected for programming have reached the appropriate verify reference voltage (Vv1, Vv2, Vv3, Vv15) Memory cells that are successfully verified to have reached their target state are locked out from further programming Additionally, step 774 includes performing detection/classification of groups (e.g., fast/slow) of memory cells separately and at appropriate time(s) for at least a subset of the programmed states, as described below.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

When storing four bits of data in each memory cell using sixteen data states, as depicted in FIGS. 8 and 9, the process of verification (see step 774 of FIG. 10) can slow down the programming process. For example, some systems will perform a verification operation for each of the fifteen possible programmed states S1-S15. Thus, each iteration (loop) of the process of FIG. 10 can include fifteen verify operations (e.g. fifteen verify pulses on the selected word line) during step 774. The large number of verify operations slows down the programming Therefore, some systems will only verify for a subset of programmed states that the memory cells could potentially be achieving. In some embodiment, the number of programmed states being verified at a given time depends on the width of the natural threshold voltage distribution. Therefore, it is proposed to reduce the amount of time needed to verify by reducing the width of the threshold voltage distribution so that less data states need to be verified at a given time.

FIG. 11 is a flow chart describing one embodiment of a process for dynamically compacting threshold voltage distributions so that less data states need to be verified at a given time and the programming process completes quicker. The compacting is performed separately and independently for each of the programmed states S1-S15. In one embodiment, the compacting is performed separately and independently for a subset of the programmed states S1-S15. The process of FIG. 11 is implemented as part of the process of FIG. 10. That is, the process of FIG. 11 is performed as part of the programming process.

In step 800, the system performs a programming operation that puts the memory cells in a program state by changing an attribute value for the memory cells. In one embodiment, the memory cells being programmed in step 800 are all (or a subset of) the memory cells connected to a common word line in a block. In step 802, the system classifies the memory cells into groups by distinguishing between different groups of memory cells based on the performance during programming of the memory cells being programmed in step 800. The classification/distinguishing of step 802 is performed independently for each program state of at least a subset of the plurality of programmed states that the memory cells are being programmed to. In step 804, the system will detect that the memory cells being programmed to the program state are in an unrefined condition, wherein such detection is done separately for each program state of at least a subset of the plurality of programmed states. In one embodiment, the plurality of the programmed states are data states S1-S15, as depicted in FIG. 8 or FIG. 9. The subset of those programmed states could include any number of those states less than all of the programmed states. One example subset would include three or more of the programmed states S1-S15, but not include all 15 programmed states. In one implementation, the subset of the programmed states includes data states S3-S15 In step 806, system refines the memory cells being programmed by adjusting the attribute values for at least a subset of the memory cells that are being programmed to the programmed state in response to the detection of step 804. The subset of memory cells for which the attribute values are being adjusted are distinguished based on the programming performance in step 802. The adjusting in step 806 is done separately for each programmed state of at least the subset of the plurality of programmed states. In one embodiment, steps 802, 804 and 806 are performed as part of the programming process. For example, steps 802, 804 and 806 can be performed concurrently with step 800.

FIG. 12 is a block diagram of one example set of components that can perform the process of FIG. 11. For example, FIG. 12 depicts control circuit 818 in communication with non-volatile memory cells 126. In one embodiment, memory cells 126 can include memory cells in a two dimensional structure or three dimensional structure (e.g., such as the structure depicted in FIGS. 4A-E). Any of various non-volatile technologies known in the art can be used to implement memory cells 126. Control circuit 818 includes programming circuit 820, classify circuit 822, detection circuit 823, and refinement circuit 826. Programming circuit 820 is used to program non-volatile memory cells 126. In one embodiment, programming circuit 820 performs step 800 of FIG. 11 (which can include performing or all or part of the process depicted in FIG. 10)). Classify circuit 822 is used to classify the memory cells, or otherwise distinguish them between different groups of memory cells based on programming performance or some other attributes. In one embodiment, classify circuit 822 performs step 802 of FIG. 11. Detection circuit 823 determines when during the programming process the relevant threshold voltage distributions will be compacted. In one embodiment, detection circuit 823 performs step 804. Refinement circuit 806 is used to adjust attribute values of a subset of memory cells in order to perform the compacting of the appropriate threshold voltage distributions. In one embodiment, refinement circuit 826 performs step 806. In one example implementation, programming circuit 820, classify circuit 822, detection circuit 823 and refinement circuit 826 are electrical circuits that are electrical circuits implemented on the same semiconductor chip as non-volatile memory cells 126. In other embodiments, circuits 820, 822, 823 and 826 can be implemented on a separate semiconductor chip. In one embodiment, programming circuit 820, classified circuit 822, detection circuit 823, and refinement circuit 826 are implemented as one single electrical circuit that can perform the four functions. For example, that single electrical circuit is referred to as control circuit 818 in FIG. 12. In one example, control circuit 818 can be implemented by state machine 112, control circuitry 110, controller 122, any one or more of the control circuits described above, or another circuit in the memory system.

In one embodiment, the attribute values referenced in step 800 of FIG. 11 is threshold voltage. In other embodiments, other attribute values can be changed (e.g., resistance, magnetism, etc.). In one embodiment, the different groups of memory cells distinguished in step 802 include fast programming memory cells and slow programming memory cells. In some embodiments, there will be only two groups that are distinguished. In other embodiments there can be four groups (e.g., very fast, fast, slow, very slow). In other embodiments there can be any other number of groups. The memory cells can also be grouped based on other characteristics. In one embodiment, the refined condition referenced in step 804 is when the population of memory cells comprising the relevant threshold voltage distribution are ready to be compacted. Other unrefined conditions can also be utilized. In one example embodiment, the adjusting the attribute values discussed above for step 806 refers to slowing down or speeding up programming by slowing down the change in threshold voltage or speeding up the change in threshold voltage during the programming process.

Figure 13:
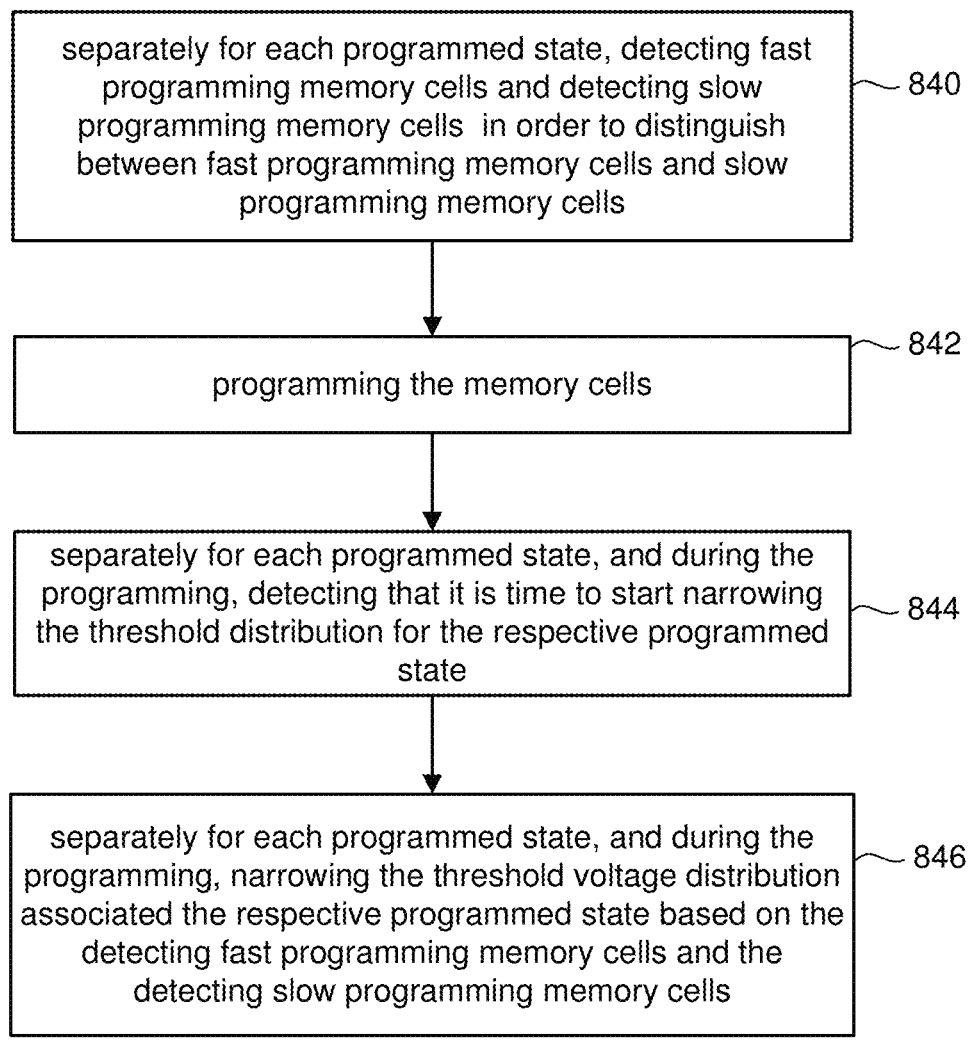
FIG. 13 is a flow chart describing one embodiment of a process for dynamically compacting threshold voltage distributions.

FIG. 13 is a flow chart describing one example implementation of the process of FIG. 11 in which the attribute values are threshold voltage, the groups of memory cells are fast and slow programming memory cells, the unrefined condition is when the memory cells are ready to be compacted, and the adjusting attribute values includes slowing down or speeding up the change in threshold voltages during programming In step 840 of FIG. 13, separately for each programmed state, the system will detect fast programming memory cells and detect slow programming memory cells in order to distinguish between the fast programming memory cells and slow programming memory cells. Step 840 can be performed by classify circuit 822, control circuit 818, state machine 112, control circuitry 110, controller 122 and/or any of the one or more control circuits described above. In step 842, the system programs the memory cells. In one embodiment, the programming in step 842 is performed by programming circuit 820, control circuit 818, state machine 112, control circuitry 110, controller 122 or any of the one or ore control circuits described above. In step 844, separately for each program state, and during the programming, the system detects that it is time to start narrowing (ie adjusting attribute values) the threshold voltage distribution for the respective program state. In one embodiment, step 844 is performed by detection circuit 823, control circuit 818, state machine 112, control circuitry 110, controller 122 or one or more of the control circuits described above. In step 846, separately for each program state, and during the programming, the system will narrow the threshold voltage distribution associated with the respective program state based on the detecting fast programming memory cells and its detecting of the slow programming memory cells from step 840. Step 846 is performed by refinement circuit 826, control circuit 818, state machine 112, control circuitry 110, controller 122, or any of the one or more control circuits described above. In one embodiment, the process of FIG. 13 is performed during a programming process; therefore, steps 840, 844 and 846 can be performed concurrently with performing step 842.

Figure 14:
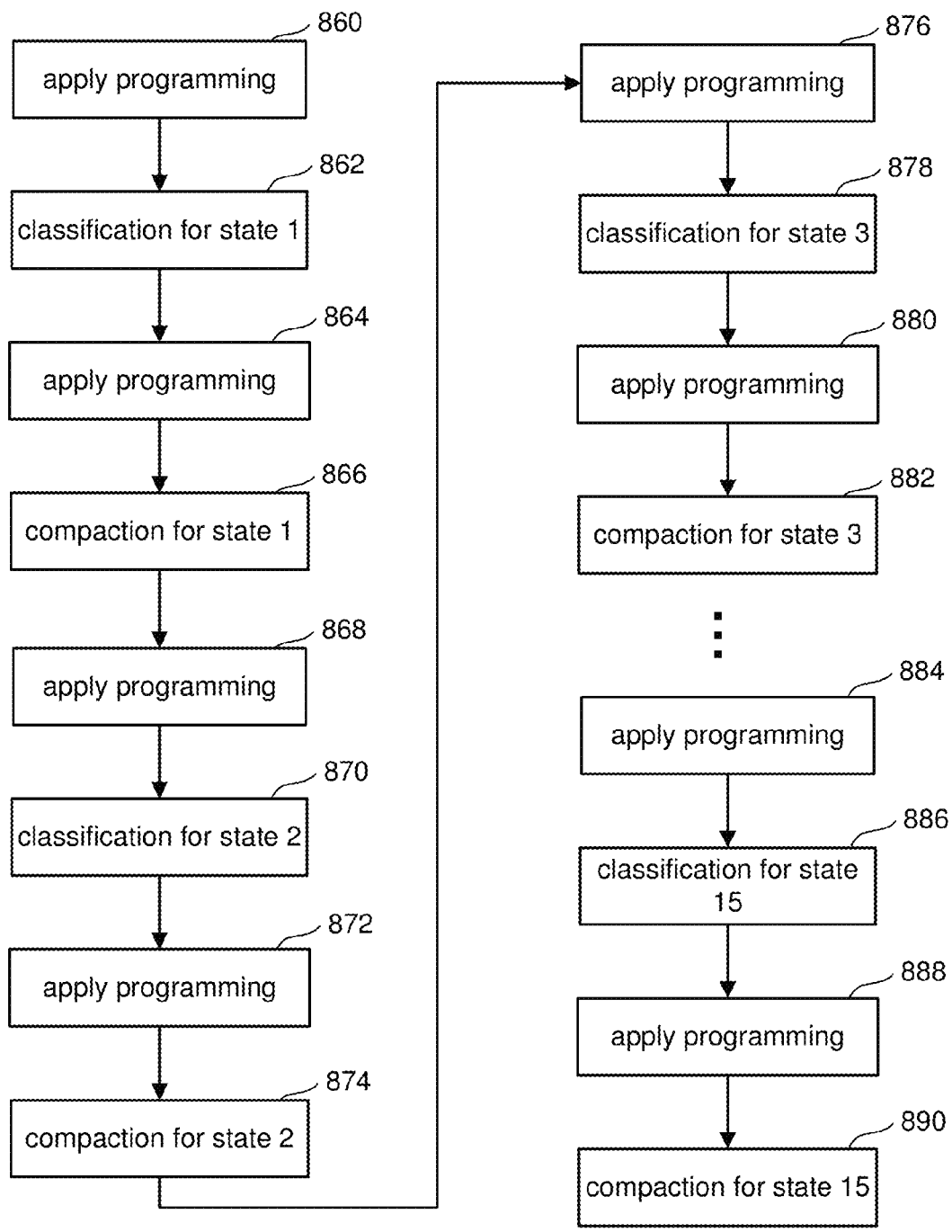
FIG. 14 is a flow chart describing one embodiment of a process for dynamically compacting threshold voltage distributions.

The process of FIG. 13 will detect fast and slow programming memory cells separately for each state and then narrow their respective threshold voltage distribution separately for each state. This concept is further described by FIG. 14. In step 860 of FIG. 14, the system applies programming to the memory cells. In step 862, classification is performed for state 1. In one embodiment classification includes the detecting fast programming memory cells and slow programming memory cells of step 840 or the distinguishing between different groups (step 802) are performed for state 1, and only state 1. In step 864, the system performs additional programming. In step 866, the system performs compaction for state 1, and only state 1. For example, the narrowing of the threshold voltage distribution for the memory cells being programmed to state 1 (step 846) or the adjusting attribute values for memory cells being programmed to state 1 (step 806) is performed for state 1, and only state 1. In step 866, the system applies programming to the selected memory cells. In step 870, classification is performed for state 2, and only state 2. In step 872, the system applies programming to the selected memory cells. In step 874, compaction is performed for state 2, and only state 2. In step 876, the system applies programming to the selected memory cells. In step 878, the system performs classification for state 3, and only state 3. In step 880, the system applies programming to selected memory cells. In step 882, the system performs compaction for state 3, and only state 3. This process continues for states 4-14 and concludes with steps 884-890. In step 884, programming is applied to the selected memory cells that have not been locked out from programming In step 886, detection is performed for those memory cells being programmed to state 15, and only state 15. In step 888, programming is applied to the remaining selected memory cells that have not been locked out. In step 890, compaction is performed for state 15, and only state 15. As can be seen, the classification and compaction is performed separately and independently for each data state/program state. Note that the process of FIG. 14 is one example embodiment, and other variations can also be implemented. In one embodiment, the detection and compaction for the states in general happen in sequential order, such as state X−1 then state X then state X+1. But this can happen in any order as well. In some cases, it may be preferable to break the order and do the detection and compaction of some higher state earlier than a lower state.

Figure 15:
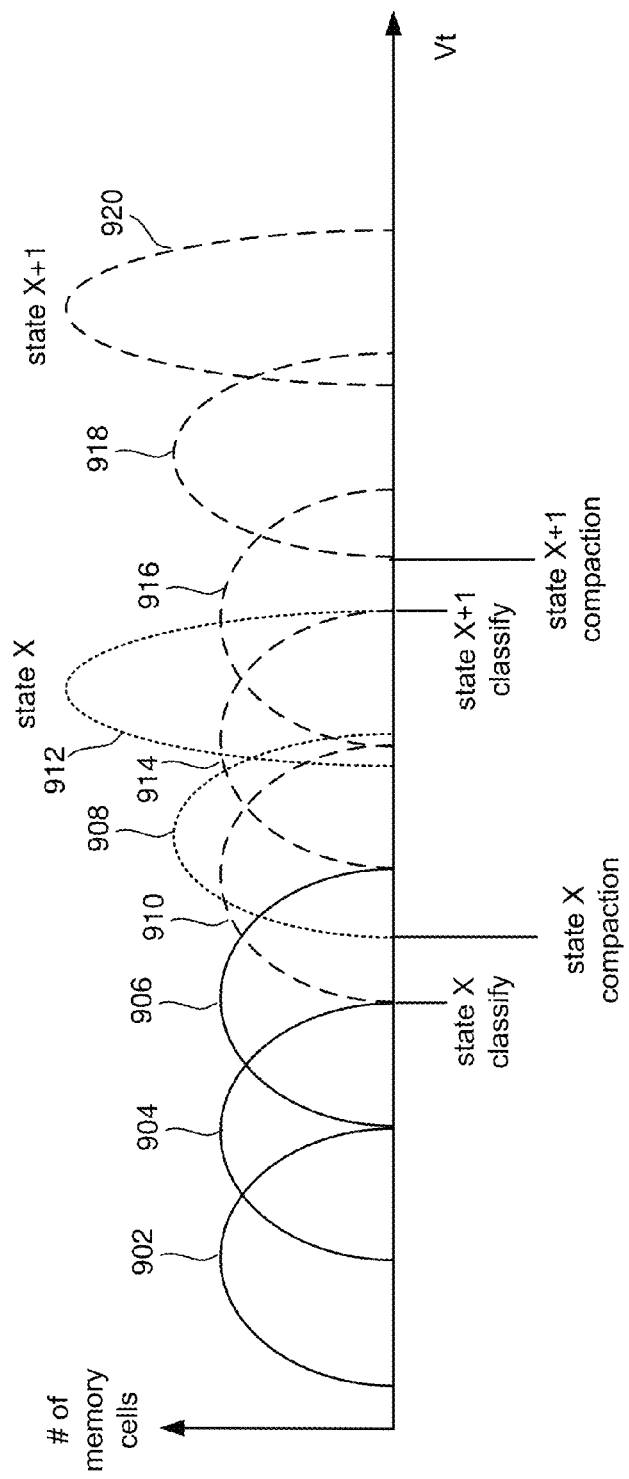
FIG. 15 depicts a set of threshold voltage distributions.

The concept of classification and compaction being performed independently for the different program states is depicted graphically in FIG. 15 which shows populations of memory cells being programmed to two neighboring states: state X and state X+1. FIG. 15 shows a set of threshold voltage distributions starting from threshold voltage distribution 902, which includes memory cells being programmed to state X and state X+1. After an additional programming pulse, the memory cells for both state X and state X+1 will be in threshold voltage distribution 904. After another programming pulse, the memory cells for both state X and state X+1 will in threshold voltage distribution 906. At this point, classification is performed for state X (see state X classify). In one embodiment, classification will be performed at the halfway point of threshold voltage distribution 906, with the memory cells having threshold voltages below that halfway point classified as slow programming memory cells and memory cells with threshold voltages above that halfway point being classified as fast programming memory cells. At the next pulse, compaction will begin for state X (see state X compaction). At this point the memory cells being programmed to state X are in a different threshold voltage distribution than memory cells being programmed to state X+1. For example, the memory cells being programmed to state X are partially compacted into threshold voltage distribution 908 while the memory cells being programmed to state X+1 are in a wider threshold distribution 910. After the next one or more programming pulses, those memory cells being programmed to state X may be further compacted into threshold voltage distribution 912 while those memory cells being programmed to state X+1 are in wider threshold voltage distribution 914. At this point, state X is completely and successfully programmed and verified; therefore, all memory cells being programmed to state X are locked out from further programming.

In response to the next programming pulse, the memory cells being programmed to state X+1 will be moved to threshold distribution 916. At this point state X+1 classification will be performed (see state X+1 classify) such that memory cells with threshold voltages in the lower half of the threshold voltage distribution line 916 are classified as slow programming memory cells and memory cells with threshold voltages in the upper half of threshold voltage distribution 916 are considered fast programming memory cells. In the next programming pulse, the compaction for state X+1 will be performed (see state X+1 compaction) such that the next threshold voltage distribution 918 will be narrowed as compared to threshold voltage 916. In response to the next programming pulse, further compaction may be performed resulting in threshold voltage distribution 920. In one embodiment, all the memory cells in threshold voltage distribution 920 are successfully programmed and verified to state X+1 and will be locked out from further programming. As can be seen from the above example, classification is performed separately (at different times and at different threshold voltages) for state X as compared to state X+1. Thus, in this embodiment, for any given state X, classification is performed after classification for state X−1 and before classification for state X+1. Similarly, in this embodiment, compaction for state X is performed after compaction for state X−1 and before compaction for state X+1. In other words, in this embodiment, classification for state X is performed at higher threshold voltages than the classification for state X−1 and at lower threshold voltages than classification for state X+1. Similarly, compaction for state X is performed at higher threshold voltages than state X−1 and lower threshold voltages than state X+1.

There are many different ways to classify memory cells into different groups (e.g., fast and slow) that are suitable for the technology described herein. FIGS. 16A, 16B, 16C, 17A and 17B describe a set of example embodiments. However, the technology disclosed herein is not limited to these exact processes for classifying the memory cells. Additionally, the technology disclosed herein is not limited to classifying based on fast/slow. In some embodiments, the processes for implementing FIGS. 16A, 16B, 16C, 17A and 17B is performed by classify circuit 822, control circuit 818, state machine 112, control circuitry 110, controller 122 and/or any of the one or more control circuits described above.

Figure 16A:
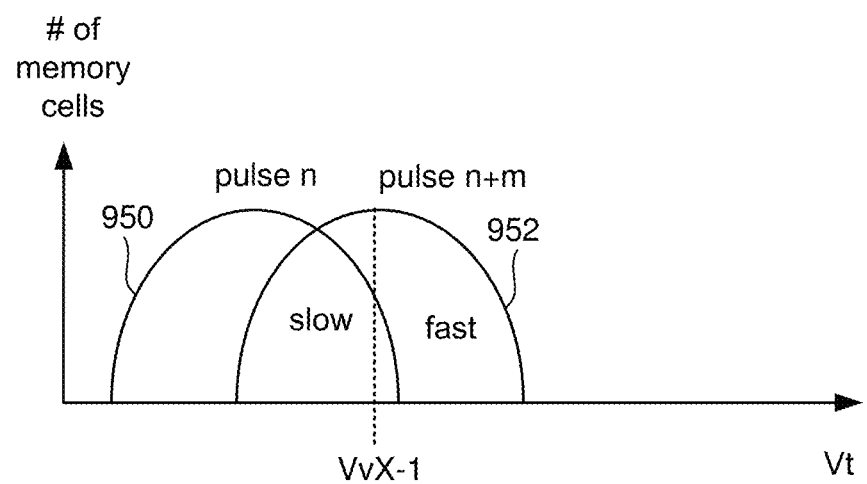
FIG. 16A depicts a set of threshold voltage distributions.

FIG. 16A shows two threshold voltage distributions 950 and 952. The graph of FIG. 16A also identifies a particular threshold voltage VvX-1. The system will monitor the threshold voltages of the memory cells being programmed until a predetermined minimum number of memory cells have their threshold voltage higher than VvX-1. This condition is depicted by threshold voltage distribution 950. FIG. 16A indicates that threshold voltage distribution 950 occurs after the nth programming pulse. After the predetermined minimum number of memory cells have a threshold voltage greater than VvX-1, the system will perform M more iterations of the programming process of FIG. 10 such that M more programming pulses are applied. Threshold voltage distribution 952 indicates the state of the memory cells after n+m programming pulses have been applied. At this point, the system will perform a sensing operation to determine which memory cells have a threshold voltage less than VvX-1 and which memory cells have a threshold voltage greater than VvX-1. For example, if VvX-1 volts are applied to the selected word line for the memory cells being programmed, those memory cells that turn on will have threshold voltages less than VvX-1 and those memory cells that do not turn on will seem to have threshold voltages greater than VvX-1. In one embodiment, those memory cells having a threshold voltage less than VvX-1 are considered slow programming memory cells and those memory cells have a threshold voltage greater than VvX-1 are considered fast programming memory cells. In one embodiment, the memory cells being classified in step 16A are being programmed to state X and VvX-1 is the verify reference voltage for state X−1. In other embodiment, VvX-1 can be replaced by any other reference voltage.

Figure 16B:
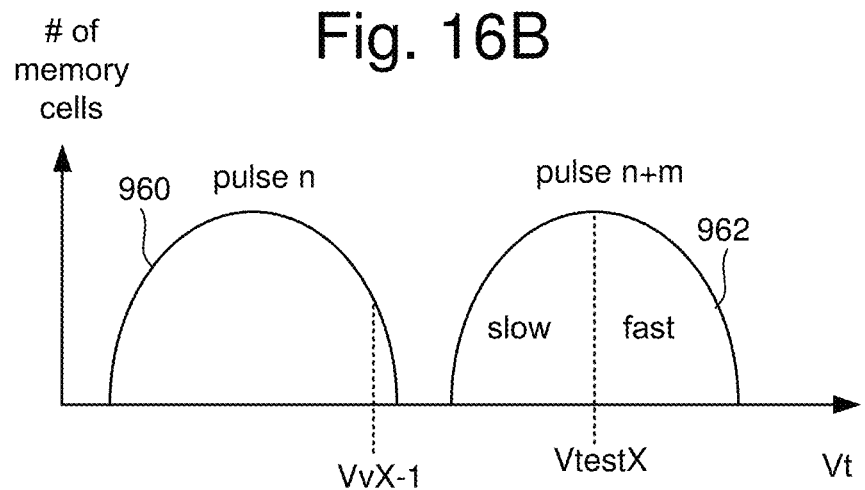
FIG. 16B depicts a set of threshold voltage distributions.

FIG. 16B depicts another alternative to the embodiment of FIG. 16A. FIG. 16B shows two threshold voltage distributions 960 and 962. FIG. 16B also indicates two threshold voltages VvX-1 and VtestX. When at least a predetermined minimum number of memory cells have their threshold voltage greater than VvX-1, as depicted by threshold voltage 960 after the nth pulse, the system will apply m more programming pulses (ie m more iterations of the process of FIG. 10). The threshold voltage distribution 962 represents the distribution of threshold voltages after n+m programming pulses. At this point, the system will perform a test to see which memory cells have a threshold voltage less than some determined test point VtestX. Those memory cells have a threshold voltage less than VtestX are considered slow programming memory cells and those memory cells having a threshold voltage greater than VtestX are considered fast programming memory cells. In the embodiment depicted in FIG. 16B, VtestX is that the halfway point of the simulated or expected threshold voltage distribution; however, in other embodiments, the test point VtestX can be at other threshold voltages.

FIG. 16C is a flowchart describing one embodiment of a process for classifying fast and slow programming memory cells. The process of FIG. 16C can be used to implement the embodiments of FIG. 16A or 16B, as well as other embodiments. In step 1002, the system performs a verify operation from memory cells being programmed for state X−1, locking out those memory cells that verify successfully. In step 1004, the system will perform a sense operation at VvX-1 for the memory cells being programmed to state X. In step 1006, the system determines whether the number of "off" bits (the number of memory cells that did not turn on because the threshold voltage is greater than VvX-1) is greater than a predetermined minimum number. If not, then no further action is taken at this time with respect to classifying memory cells being programmed to state X (step 1008). If the number of "off" bits are greater than the predetermined minimum, then in step 1010 the system will perform m more programing pulses. In step 1012, a sense operation is performed at VvX-1 (after m programming pulses) for the memory cells being programmed to state X. Alternatively, the sense operation will be performed at a level other than VvX-1. In step 1014, memory cells that turn on in response to VvX-1 have a threshold voltage below VvX-1 and, therefore, are considered slow programming memory cells. For those slow programming cells, a zero is stored in the appropriate latch. Looking back at FIG. 3C, each of the sense blocks 129 includes a set of data latches 494. In one embodiment, there are three data latches for each bit line. In another embodiment, more than three data latches can be used for each bit line. One of those data latches is used to store a zero for slow programming memory cells and a one for fast programming memory cells. Other encoding of fast and slow can also be used. In one embodiment, the data will remain in a latch for the entire programming process (the process of FIG. 10). In other embodiments, the indication of fast or slow can remain in the latches for the life of device. In step 1016, memory cells that do not turn on in response to the sense operation at VvX-1 (or other level) are considered fast programming memory cells. For those fast programming memory cells, logic one is stored in the appropriate latch.

In step 1012 of FIG. 16C, the sense operation can be performed at voltages other than VvX-1. For example, when implementing the embodiment of FIG. 16B, the sense operation can be performed at VtestX.

Note that steps 1002-1016 will be performed multiple times during a programming process, such as once for each state being compacted during each iteration of the programming process of FIG. 10.

Figure 17A:
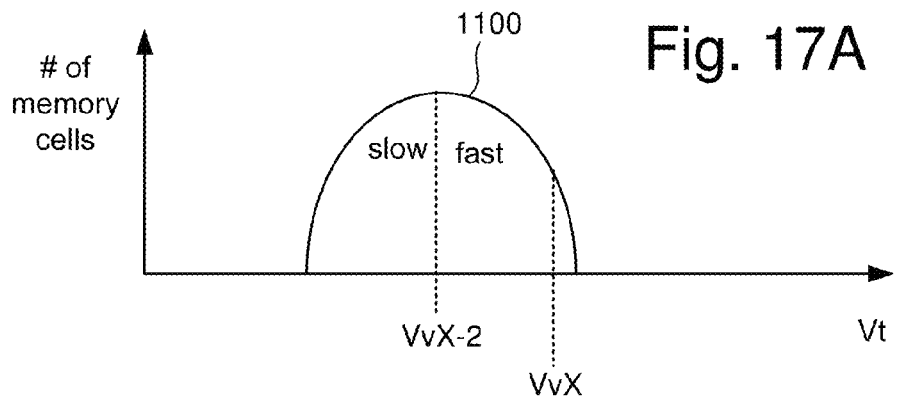
FIG. 17A depicts a set of threshold voltage distributions.

FIG. 17A depicts a threshold voltage 1100, and two specific threshold voltage points VvX-2 and VvX. In one embodiment, for memory cells being programmed to data state Y, when a predetermined number of memory cells have a threshold voltage greater than VvX (the verify reference point for state X), then the system will test whether all memory cells being programmed to state Y have a threshold voltage greater than or less than VvX-2 (the verify reference point for state X−2). Those memory cells having a threshold voltage less than VvX-2 are considered slow programming memory cells. Those memory cells having a threshold value voltage greater than VvX-2 are considered fast programming memory cells. In some embodiments, the test for slow versus fast can be performed at a different threshold voltage than VvX-2. In other embodiments, the trigger point can be other than VvX.

Figure 17B:
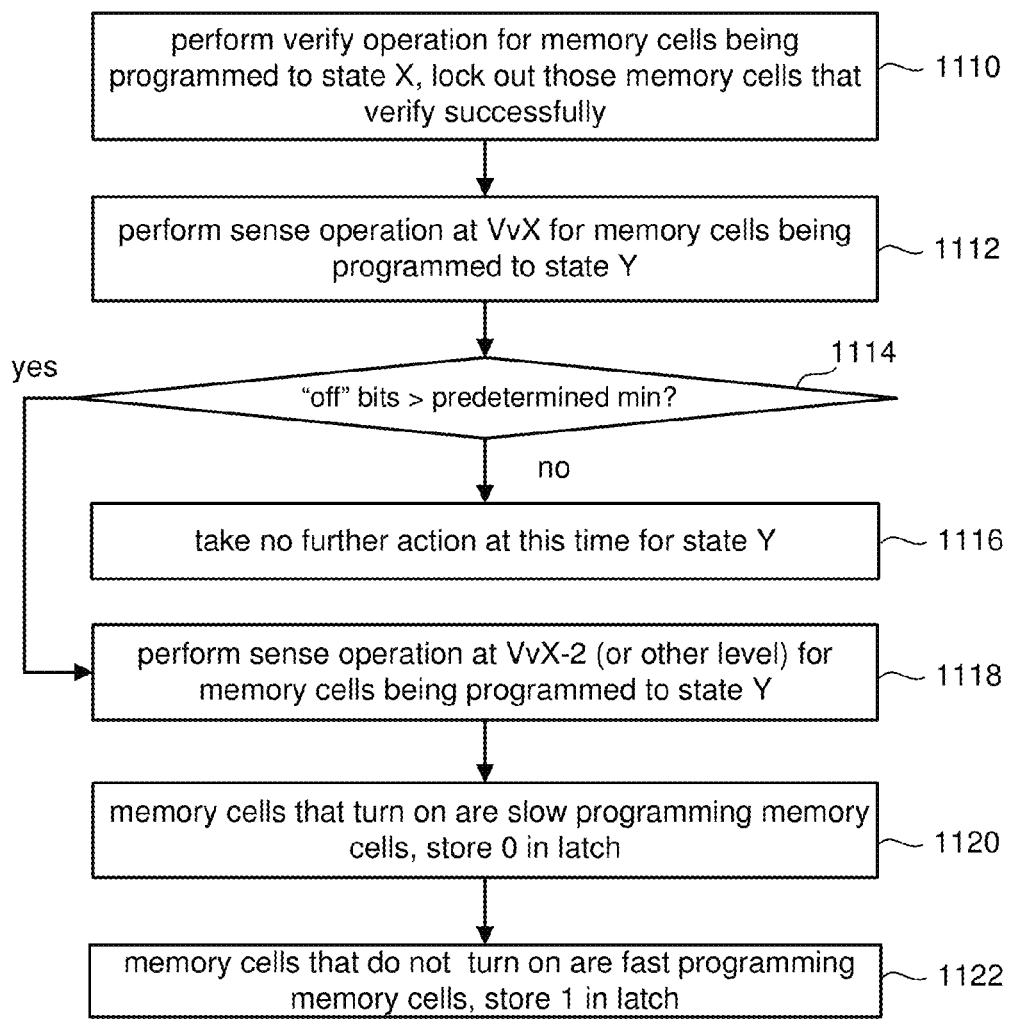
FIG. 17B is a flow chart describing one embodiment of a process for performing the classification of fast and slow programming memory cells.

FIG. 17B is a flow chart describing one embodiment for performing the classification of fast and slow programming memory cells based on the graph of FIG. 17A. In step 1110, the system performs a verify operation for memory cells being programmed to state X, locking out those memory cells that verify successfully. In step 1112, the system performs a sense operation at VvX (or other threshold voltage) from memory cells being programmed to state Y. In one embodiment steps 1110 and 1112 can be performed together. If (step 1114), the system determines that the number of off bits (memory cells that did not turn on in response to VvX because their threshold voltage is greater than VvX) is not greater than a predetermined minimum number, then no further action is taken at this time as part of the classification for state Y (step 1116). If (step 1114), the system determines that the number of off bits (memory cells that did not turn on in response to VvX because their threshold voltage is greater than VvX) is greater than a predetermined minimum number, then a sense operation is performed at VvX-2 (or other level) for memory cells being programmed to state Y (see step 1118). In step 1120, memory cells that turn on in response to sense operation of VvX-2 (because that threshold voltage is less than VvX-2) are considered slow programming memory cells (see FIG. 17A). For those slow programming memory cells, a zero is stored in the appropriate latch. In step 1122, memory cells that do not turn on in response to the sense operation at VvX-2 (because their threshold voltage is greater than VvX-2) are considered fast programming memory cells. For fast programming memory cells, data one is stored in the appropriate latch.

FIGS. 16A, 16B, 16C, 17A and 17B describe examples of how to distinguish between fast programming memory cells and slow programming memory cells. FIGS. 18-22 provide examples of how to narrow the threshold voltage distributions based on knowing which memory cells are fast programming cells and which memory cells are slow programming cells. Thus FIGS. 18-22 provide example embodiments of step 806 of FIG. 11 (adjusting attribute values) and step 846 of FIG. 13 (narrowing threshold voltage distributions). In one embodiment, the functions described by FIGS. 18-22 are performed by refinement circuit 826, control circuit 818, state machine 112, control circuitry 110, controller 122, or any of the one or more control circuits described above.

Figure 18:
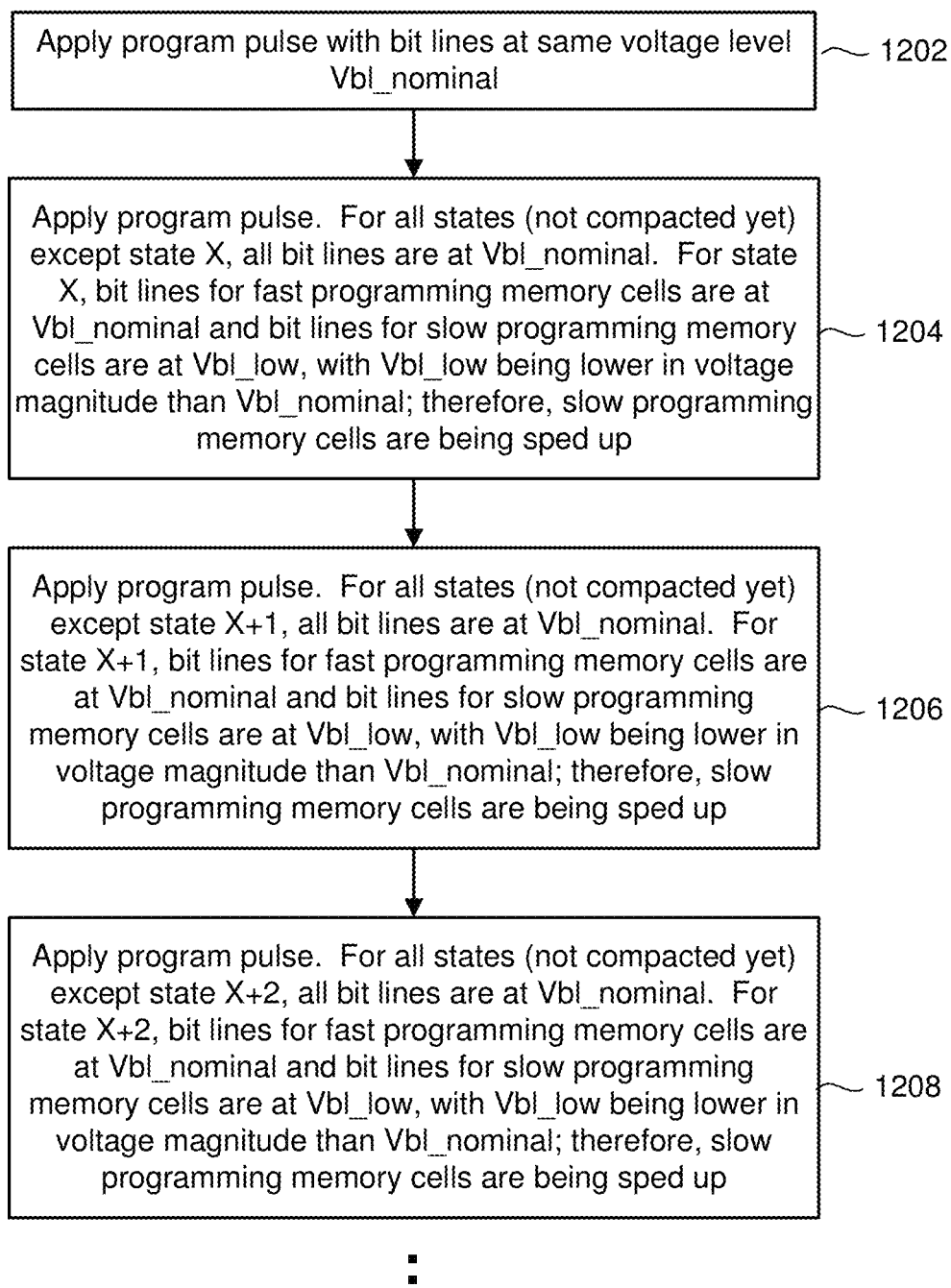
FIG. 18 is a flow chart describing one embodiment of a process for increasing the speed of slow programming memory cells.

FIG. 18 is a flowchart describing one embodiment for increasing the speed of slow programming memory cells by decreasing the bit line voltage. By increasing the speed of slow programming memory cells, the threshold voltage distribution will be compacted (or narrowed). In step 1202 of FIG. 18, the system applies a programming pulse with bit lines at the same voltage level. One example voltage level for the bit lines associated with memory cells being programmed is Vbl_nominal. Step 1202 can be repeated multiple times prior to any states being compacted or narrowed.

Step 1204 describes the narrowing process for a threshold voltage distribution associated with state X, which can be any of the states being compacted. In step 1204, a program pulse is applied. For all states (not compacted yet) except data state X, all bit lines (except locked ones) will receive the voltage Vbl_nominal. For data state X, bit lines for fast programming memory cells will receive Vbl_nominal and bit lines for slow programming memory cells will receive the voltage Vbl_low. The voltage Vbl_low is lower in voltage magnitude than Vbl_nominal Therefore, slow programming memory cells are being sped up. Note that the states which are already compacted may continue receiving the Vbl_low for the slow programming cells and Vlb_nominal for the fast programming memory cells.

Step 1206 includes compacting the special voltage distribution for data state X+1. In this embodiment, the process of step 1206 will be performed after step 1204. Therefore, data state X+1 is compacted after data state X. In step 1206, a program pulse is applied. For example, the program pulse is applied to the bit selected word line. For all data states (not compacted yet) except data state X+1, all the bit lines (except locked ones) will receive the voltage Vbl_nominal. For data state X+1, the bit lines for fast programming memory cells will receive the voltage Vbl_nominal and bit lines for slow programming memory cells will receive the voltage Vb_low.

Step 1208 includes compacting data state X+2. As can be seen from FIG. 18, in this embodiment, the threshold voltage distribution for state X+2 is compacted after the compacting for data state X+1 and after the compacting for data state X. The compacting the threshold voltage of data state X+1 is performed after the compacting for state X and prior to the compacting for data state X+2. In step 1208, a program pulse is applied. For example, the voltage pulse is applied to the selected word line. For all data states (not compacted yet) except data state X+2, all bit lines (except locked ones) will receive the voltage Vbl_nominal. For data state X+2, bit lines for fast programming memory cells will receive Vbl_nominal, and bit lines for slow programming memory cells will receive Vbl_low. In steps 1204, 1206 and 1208, the slower memory cells will receive the lower bit line voltage which will have the effect of speeding up the programming for slow programming memory cells. The process of FIG. 18 will continue for the additional states X+3, X+4, X+5, etc.

Figure 19:
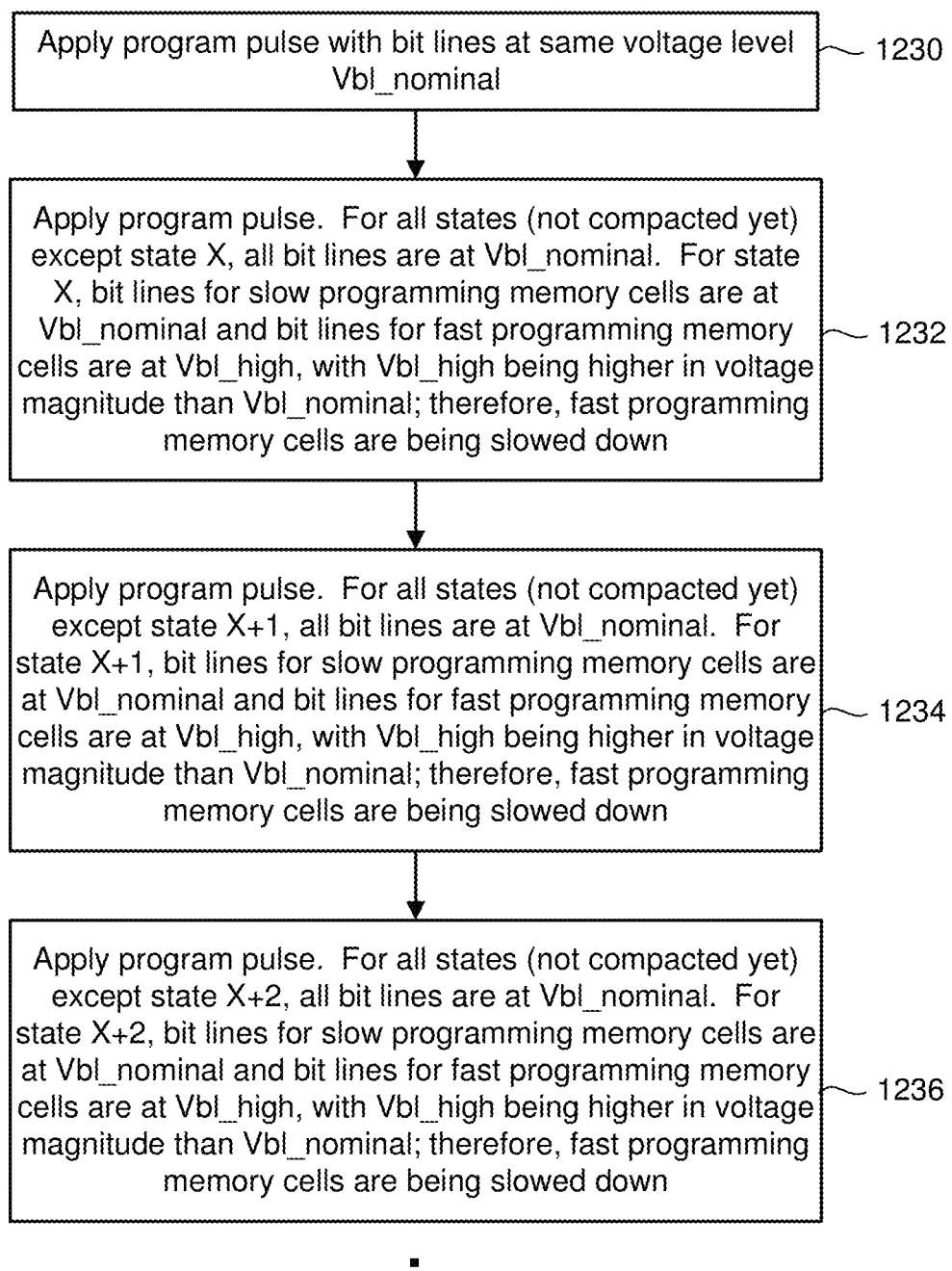
FIG. 19 is a flow chart describing one embodiment of a process for compacting/narrowing threshold voltage distributions.

FIG. 19 describes another embodiment for compacting/narrowing threshold voltage distributions. The process of FIG. 19 slows down programming for fast programming memory cells by increasing the bit line voltage for the fast programming memory cells. In step 1230, a program pulse is applied to the word line selected for programming. All bit lines will receive the same voltage, Vbl_nominal Step 1230 can be performed one or multiple times prior to any data states being compacted or narrowed.

Step 1232 includes compacting the threshold voltage distribution associated with memory cells being programmed to data state X. In step 1232, a program pulse is applied to the selected word line. For all data states (not compacted yet) except data state X, all the bit lines associated with the memory cells being programmed to those data states will receive the nominal bit line voltage Vbl_nominal. For memory cells being programmed to data state X, the bit lines for slow programming memory cells will receive Vbl_nominal. Bit lines for fast programming memory cells will receive the voltage Vbl_high. The voltage Vbl_high is higher in voltage magnitude than Vbl_nominal Because the faster programming memory cells are receiving a higher bit line voltage, programming for those memory cells is being slowed down.

Step 1234 includes contacting or narrowing a threshold voltage distribution for data state X+1. In step 1234, a program pulse is applied to the selected word line. For all data states (not compacted yet) except data state X+1, all bit lines connected to memory cells being programmed are set at Vbl_nominal. For data state X+1, bit lines for the slow programming memory cells receive Vbl_nominal Bit lines for fast programming memory cells receive Vbl_high.

Step 1236 includes compacting and narrowing the threshold voltage distribution for state X+2. In step 1236, a program pulse is applied to the selected word line. For all states (not compacted yet) except state X+2, all bit lines are set at Vbl_nominal. For state X+2, bit lines for slow programming memory cells are at Vbl_nominal and bit lines for fast programming memory cells are at Vbl_high. The process of FIG. 19 can continue for states X+3, X+4, X+5, etc.

Figure 20A:
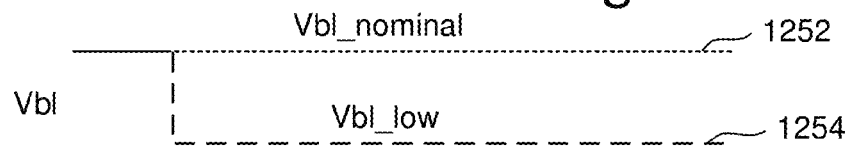
FIGS. 20A-D depict bit line voltages.

FIG. 20A graphically depicts the bit line voltages associated with the process of FIG. 18. As per steps 1204, 1206 and 1208, fast programming memory cells will continue to receive Vbl_nominal (1252) and slow programming memory cells will receive Vbl_low (1254).

Figure 20B:
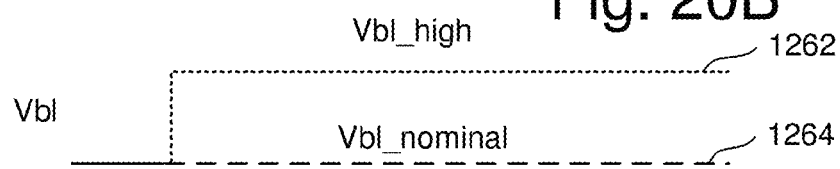

FIG. 20B depicts the bit line voltage associated with the process of FIG. 19. As per steps 1232, 1234 and 1236, bit lines for slow programming memory cells will continue to receive Vbl_nominal (1264) while bit lines connected to fast programming memory cells will receive Vbl_high (1262).

Figure 20C:
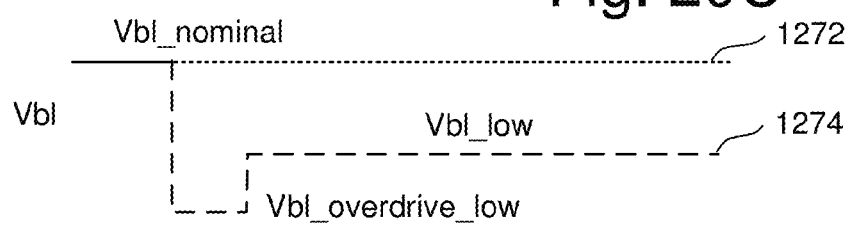

FIG. 20C shows a variation on the process of FIG. 18 and FIG. 20A. Bit lines connected to fast programming memory cells will still receive Vbl_nominal (1272). However, bit lines connected to slow programming memory cells will receive an overdrive voltage followed by the slow programming memory cell voltage. That is, bit lines connected to slow programming memory cells will first receive an overdrive voltage Vbl_overdrive_low for a short period of time and then those bit lines will be raised to Vbl_low (1274).

Figure 20D:
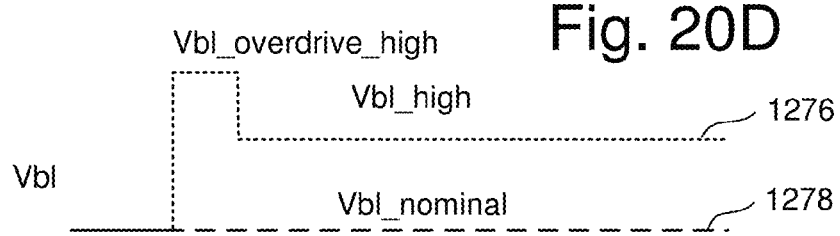

FIG. 20D depicts a variation on the process of FIG. 19 and FIG. 20B. The bit lines connected to slow programming memory cells will still receive Vbl_nominal (1278). However, fast programming memory cells will first receive an overdrive voltage Vbl_overdrive_high for a short period of time and then those bit lines will be lowered to Vbl_high (1276).

Figure 21:
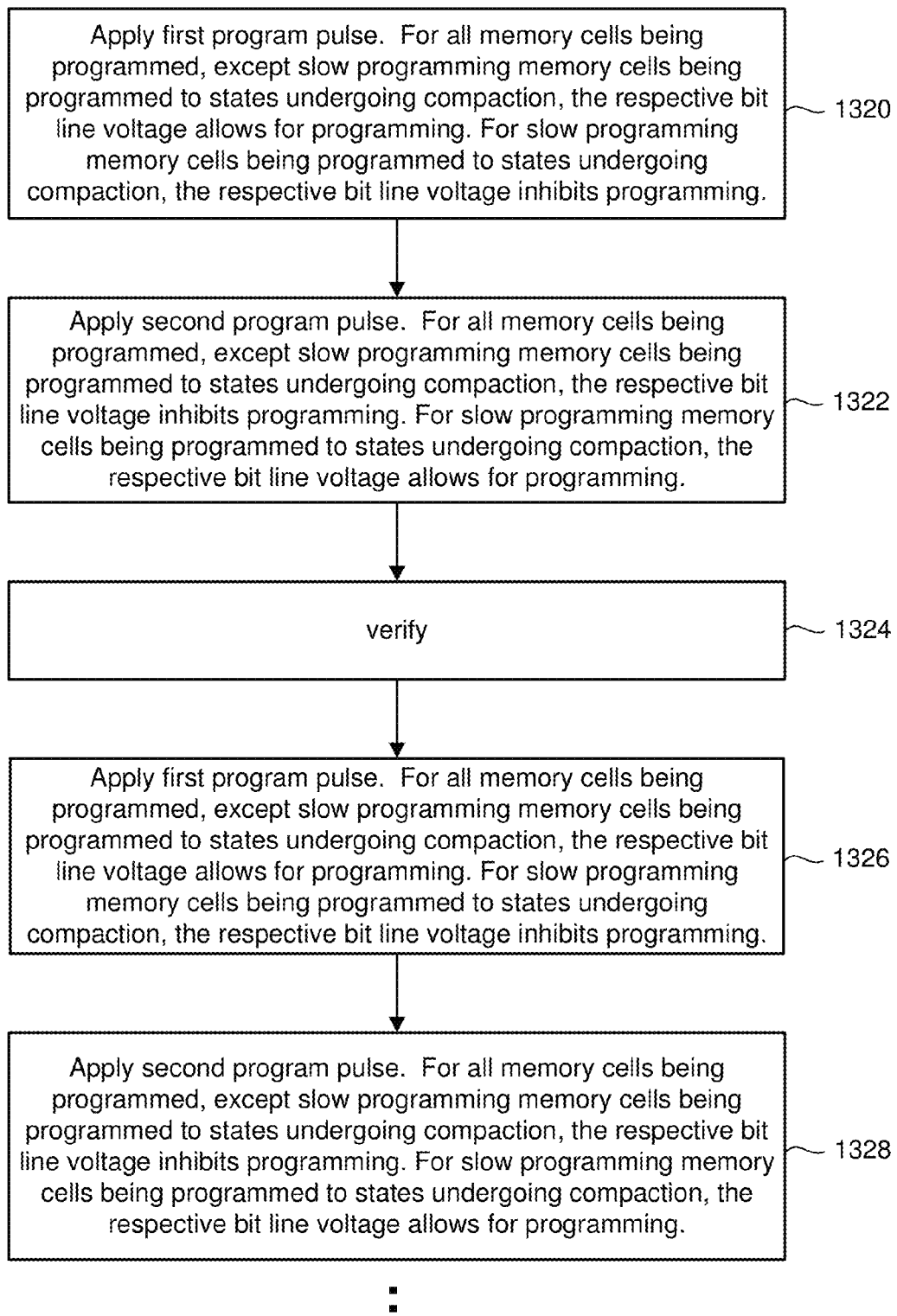
FIG. 21 is a flow chart describing one embodiment of a process for compacting/narrowing threshold voltage distributions.

FIG. 21 depicts another embodiment for compacting or otherwise narrowing threshold voltage distributions for a given programmed state. The process of FIG. 21 will compact the memory cells by applying two programming pulses to the selected word line: one programming pulse for the fast programming memory cells and one programming pulse for the slow programming memory cells. In this way, either the fast programming memory cells can be slowed down or the slow programming memory cells can be sped up. FIG. 22 graphically depicts the process of FIG. 21, by showing programming pulses 1352, 1354, 1356, 1358, 1360 and 1362.

In step 1320 of FIG. 21, a first program pulse is applied to the selected word line. For all memory cells being programmed, except slow programming memory cells being programmed to states undergoing compaction, the respective bit line voltage allows for programming. For example, the bit lines can be set at 0 volts. For slow programming memory cells being programmed to states undergoing compaction, the respective bit line voltage inhibits programming. For example, a bit line voltage of Vdd (e.g., 3.5-5.0 volts) is applied. In step 1322 a second program pulse is applied to the selected word line. For all memory cells being programmed, except slow programming memory cells being programmed to states undergoing compaction, the respective bit line voltage inhibits programming. For slow programming memory cells being programmed to states undergoing compaction, the respective bit line voltage allows for programming In one embodiment, steps 1320 and 1322 are both performed during one iteration of step 772 of FIG. 10. FIG. 22 shows programming pulse 1352 being applied during step 1320 and programming pulse 1354 being applied during step 1322. As can be seen, programming pulse 1354 is greater in voltage magnitude than programming pulse 1352 by Δ.

In one embodiment, steps 1320 and 1322 are performed after at least one state is undergoing compaction (or otherwise narrowing its threshold voltage distribution). Prior to any states undergoing compaction, all memory cells will be programmed using the first program pulse (the program pulse for fast programming memory cells), such as program pulse 1352.

In step 1324, verify operations are performed, as described above. Step 1324 corresponds to one iteration of step 774 of FIG. 10.

In step 1326 of FIG. 21, a first program pulse is applied to the selected word line. For all memory cells being programmed, except slow programming memory cells being programmed to states undergoing compaction, the respective bit line voltage allows for programming. For slow programming memory cells being programmed to states undergoing compaction, the respective bit line voltage inhibits programming In step 1328 a second program pulse is applied to the selected word line. For all memory cells being programmed, except slow programming memory cells being programmed to states undergoing compaction, the respective bit line voltage inhibits programming. For slow programming memory cells being programmed to states undergoing compaction, the respective bit line voltage allows for programming In one embodiment, steps 1326 and 1328 are both performed during one iteration of step 772 of FIG. 10. FIG. 22 shows programming pulse 1356 being applied during step 1326 and programming pulse 1358 being applied during step 1328. As can be seen, programming pulse 1358 is greater in voltage magnitude than programming pulse 1356 by Λ.

Because, for each iteration in the programming process, the slower programming memory cells will receive a higher voltage programming pulse than the faster programming memory cells, the programming for these slower programming memory cells will be sped up. By speeding up the slower programming memory cells, the threshold voltage distribution will be compacted or narrowed.

One embodiment includes an apparatus, comprising: non-volatile memory cells configured to have an attribute value representative of one programmed state of a plurality of programmed states; and a control circuit in communication with the memory cells. The control circuit comprises a programming circuit configured to perform a programming operation that puts the memory cells in a programmed state by changing the attribute value for the memory cells, a detection circuit configured to detect that the memory cells being programmed to the programmed state are in an unrefined condition, wherein the detection circuit does detection separately for each programmed state of at least a subset of the plurality of programmed states; and a refinement circuit configured to adjust attribute values for a subset of the memory cells being programmed to the programmed state in response to the detection circuit.

One embodiment includes an apparatus, comprising: a plurality of non-volatile memory cells configured to store data in a plurality of programmed states; and one or more control circuits in communication with the memory cells. The one or more control circuits configured to perform a programming process that programs the memory cells into the programmed states. Based on programming performance the one or more control circuits configured to distinguish between different groups of memory cells for the programmed state independently for each program state of at least a subset of the plurality of programmed states. Based on the distinguishing the one or more control circuits configured to narrow threshold voltage distributions of the memory cells during the programming process.

One embodiment includes a method, comprising: detecting fast programming memory cells of a population of non-volatile memory cells; detecting slow programming memory cells of the population of non-volatile memory cells; and programming the population of memory cells to a plurality of programmed states including narrowing threshold voltage distributions associated the programmed states based on the detecting fast programming memory cells and the detecting slow programming memory cells. For each programmed state of at least a subset of programmed states the narrowing is performed after narrowing of a lower programmed state and prior to narrowing for a higher programmed state.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells configured to store data in a plurality of programmed states; and
one or more control circuits in communication with the memory cells, the one or more control circuits configured to perform a programming process that programs the memory cells into the programmed states, based on programming performance the one or more control circuits configured to distinguish between different groups of memory cells for the programmed state independently for each program state of at least a subset of the plurality of programmed states, based on the distinguishing the one or more control circuits configured to narrow threshold voltage distributions of the memory cells during the programming process.

2. The apparatus of claim 1, wherein:
the one or more control circuits configured to narrow threshold voltage distributions of the memory cells independently for each program state of at least the subset of the plurality of programmed states.

3. The apparatus of claim 1, wherein:
the one or more control circuits configured to determine when to separately start narrowing threshold voltage distributions for each program state of at least the subset of the plurality of programmed states.

4. The apparatus of claim 1, wherein:
the one or more control circuits configured to narrow threshold voltage distributions such that for each programmed state of at least a subset of programmed states the narrowing is performed at different threshold voltages than narrowing of a lower programmed state and at different threshold voltages than narrowing for a higher programmed state.

5. The apparatus of claim 1, wherein:
the one or more control circuits configured to narrow threshold voltage distributions such that for each programmed state of at least a subset of programmed states the narrowing is performed after narrowing for a lower programmed state and before narrowing for a higher programmed state.

6. The apparatus of claim 1, wherein:
the one or more control circuits configured to distinguish between different groups of memory cells for the programmed state by distinguishing between fast programming memory cells and slow programming memory cells; and
the one or more control circuits configured to narrow threshold voltage distributions
such that threshold voltages of fast programming memory cells are intermixed with threshold voltages of slow programming memory cells.

7. The apparatus of claim 1, wherein:
the plurality of non-volatile memory cells are arranged in a three dimensional structure.

8. An apparatus, comprising:
a plurality of non-volatile memory cells; and
one or more control circuits in communication with the memory cells, the one or more control circuits configured to program the memory cells into programmed states, the one or more control circuits configured to distinguish between fast programming memory cells and slow programming memory cells and compact threshold voltage distributions of the memory cells separately for each of a plurality of the programmed states so that threshold voltages of slow programming memory cells change faster than threshold voltages of fast programming memory cells.

9. The apparatus of claim 8, wherein:
the one or more control circuits configured to distinguish between fast programming memory cells and slow programming memory cells separately for each of the plurality of programmed states.

10. The apparatus of claim 8, wherein:
the one or more control circuits configured to compact threshold voltage distributions of the memory cells separately for each of the plurality of the programmed states such that compaction is performed at different threshold voltages for different programmed states.

11. The apparatus of claim 8, wherein:
the one or more control circuits configured to compact threshold voltage distributions such that for each programmed state of the plurality of the programmed states the compaction is performed after compaction for a lower programmed state and before compaction for a higher programmed state.

12. The apparatus of claim 8, wherein:
the one or more control circuits configured to compact threshold voltage distributions by increasing speed of programming of slow programming memory cells.

13. The apparatus of claim 12, wherein:
the one or more control circuits configured to increase speed of programming of slow programming memory cells by decreasing bit line voltages for slow programming memory cells.

14. The apparatus of claim 12, wherein:
the one or more control circuits configured to increase speed of programming of slow programming memory cells by decreasing bit line voltages for slow programming memory cells from a first voltage to a second voltage and subsequently raising bit line voltages to a third voltage that is lower than the second voltage.

15. The apparatus of claim 8, wherein:
the one or more control circuits configured to compact threshold voltage distributions by slowing programming of fast programming memory cells.

16. The apparatus of claim 15, wherein:
the one or more control circuits configured to slow programming of fast programming memory cells by increasing a bit line voltage for fast programming memory cells.

17. The apparatus of claim 8, wherein:
the one or more control circuits configured to compact threshold voltage distributions by applying a first set of program pulses to slow programming memory cells and a second set of program pulses to fast programming memory cells, the first set of program pulses are higher in magnitude than corresponding pulses in the second set of program pulses.

18. The apparatus of claim 8, wherein:
the one or more control circuits configured to distinguish between fast programming memory cells and slow programming memory cells by testing which memory cells have threshold voltages greater than a test level a predetermined number of cycles after a minimum number of memory cells are detected to have threshold voltages greater than a trigger level.

19. The apparatus of claim 8, wherein:
the one or more control circuits configured to distinguish between fast programming memory cells and slow programming memory cells by testing which memory cells have threshold voltages greater than a test level if a minimum number of memory cells are detected to have threshold voltages greater than a trigger level.

20. An apparatus, comprising:
a plurality of non-volatile memory cells; and
one or more control circuits in communication with the memory cells, the one or more control circuits comprise means for concurrently programming multiple sets of the memory cells from a starting threshold voltage distribution to a plurality of target threshold voltage distributions and separately compacting threshold voltage distributions for the sets of the memory cells such that each set is programmed to a different target threshold voltage distribution and has a different starting point for compaction.

* * * * *